United States Patent
Meyer et al.

(10) Patent No.: US 9,543,224 B1
(45) Date of Patent: Jan. 10, 2017

(54) HYBRID EXPOSURE FOR SEMICONDUCTOR DEVICES

(71) Applicant: INTEL IP CORPORATION, Santa Clara, CA (US)

(72) Inventors: Thorsten Meyer, Regensburg (DE); Gerald Ofner, Regensburg (DE); Robert L. Sankman, Phoenix, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/964,494

(22) Filed: Dec. 9, 2015

(51) Int. Cl.
| | | |
|---|---|---|
| *H01L 23/48* | (2006.01) | |
| *H01L 21/66* | (2006.01) | |
| *H01L 21/56* | (2006.01) | |
| *H01L 21/48* | (2006.01) | |
| *H01L 23/31* | (2006.01) | |
| *H01L 23/498* | (2006.01) | |
| *H01L 23/66* | (2006.01) | |
| *H01L 21/60* | (2006.01) | |

(52) U.S. Cl.
CPC .......... *H01L 22/20* (2013.01); *H01L 21/4853* (2013.01); *H01L 21/565* (2013.01); *H01L 21/568* (2013.01); *H01L 22/12* (2013.01); *H01L 23/3114* (2013.01); *H01L 23/49816* (2013.01); *H01L 23/49838* (2013.01); *H01L 23/66* (2013.01); *H01L 2021/60292* (2013.01)

(58) Field of Classification Search
CPC ...... H01L 22/20; H01L 22/12; H01L 23/3114; H01L 23/49838; H01L 23/5389; H01L 21/4853; H01L 21/565; H01L 21/568; H01L 24/97; H01L 2224/06137
USPC .......................................................... 257/738
See application file for complete search history.

(56) References Cited

U.S. PATENT DOCUMENTS

| | | | |
|---|---|---|---|
| 2012/0214277 A1* | 8/2012 | Josef Poeppel | H01L 23/3128 438/107 |
| 2016/0064334 A1* | 3/2016 | Bishop | H01L 23/544 438/15 |

* cited by examiner

*Primary Examiner* — Tu-Tu Ho
(74) *Attorney, Agent, or Firm* — Blakely, Sokoloff, Taylor & Zafman LLP

(57) ABSTRACT

Semiconductor packages and methods, systems, and apparatuses of forming such packages are described. A method of forming a semiconductor package may include encapsulating a semiconductor die with a molding compound, applying a seed layer on the die and the molding compound, applying a resist layer on the seed layer, exposing a first portion of the resist layer, and exposing a second portion of the resist layer. The first portion can include a first area of the resist layer to be used for forming a redistribution layer (RDL) without including a second area of the resist layer to be used for forming an electrical communications pathway between at least one of the contact pads and the RDL. The second portion can include the second area of the resist layer that includes the electrical communications pathway.

25 Claims, 18 Drawing Sheets

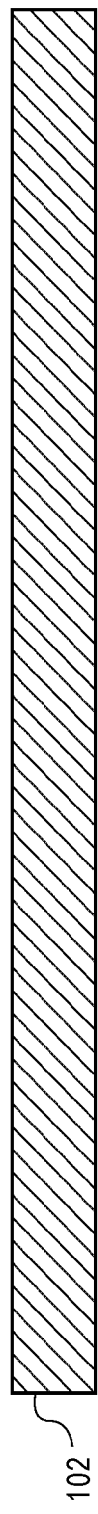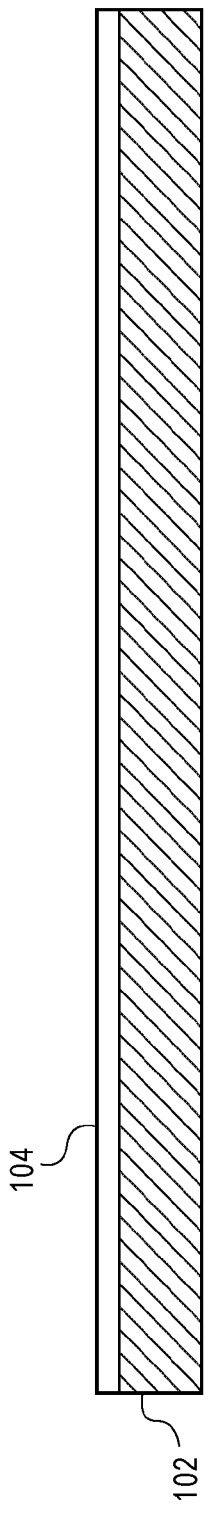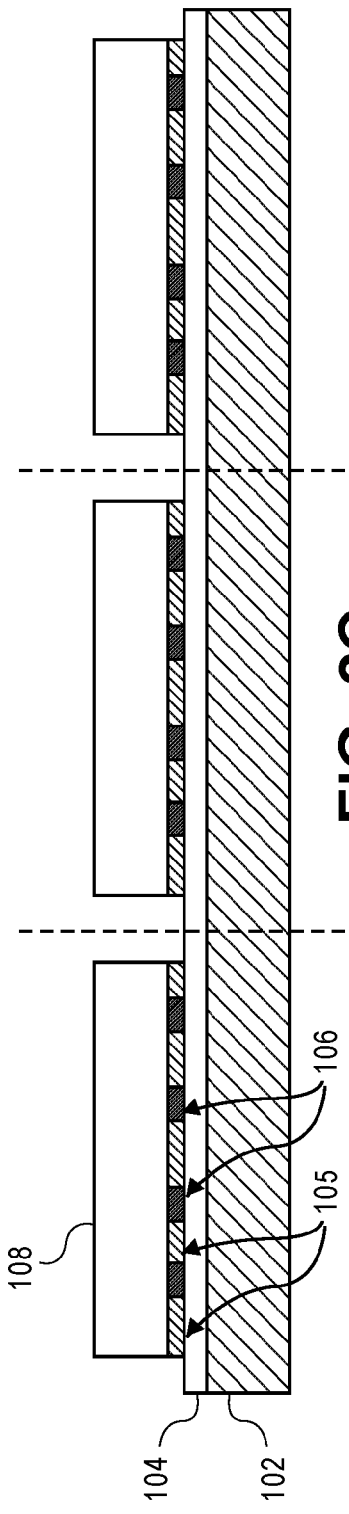

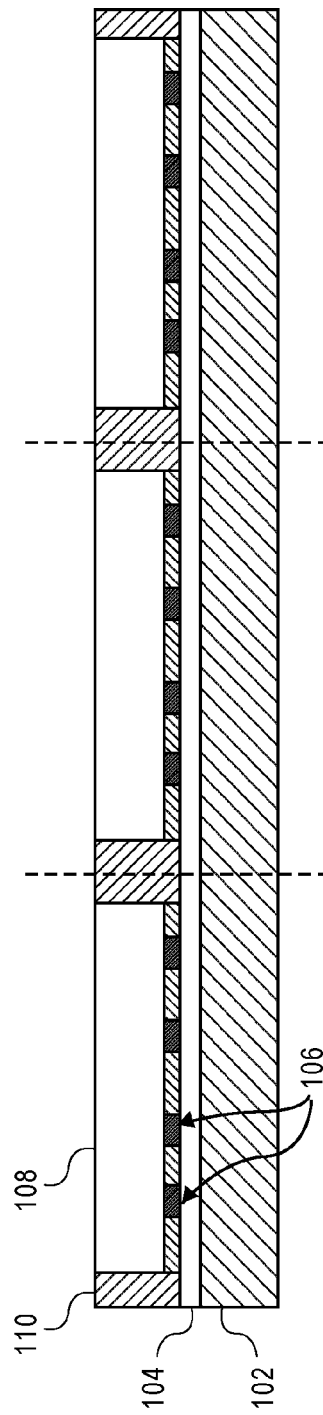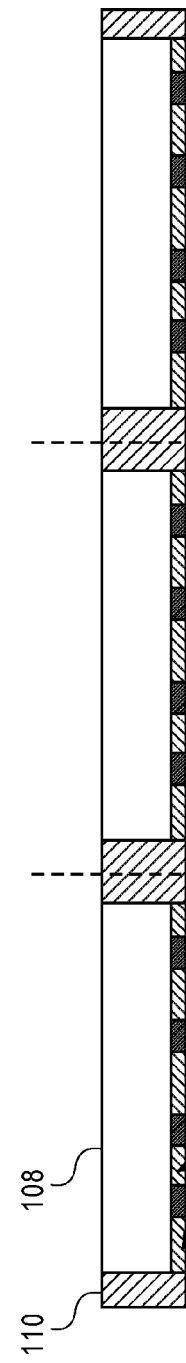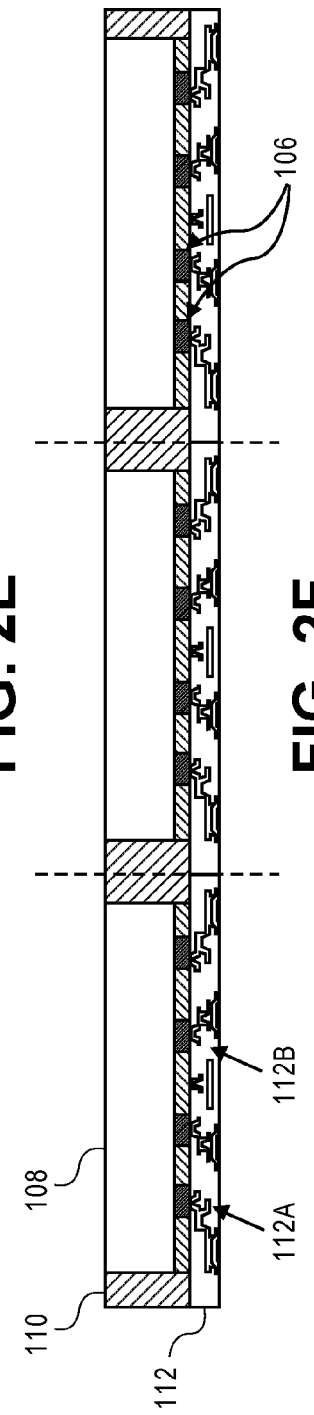

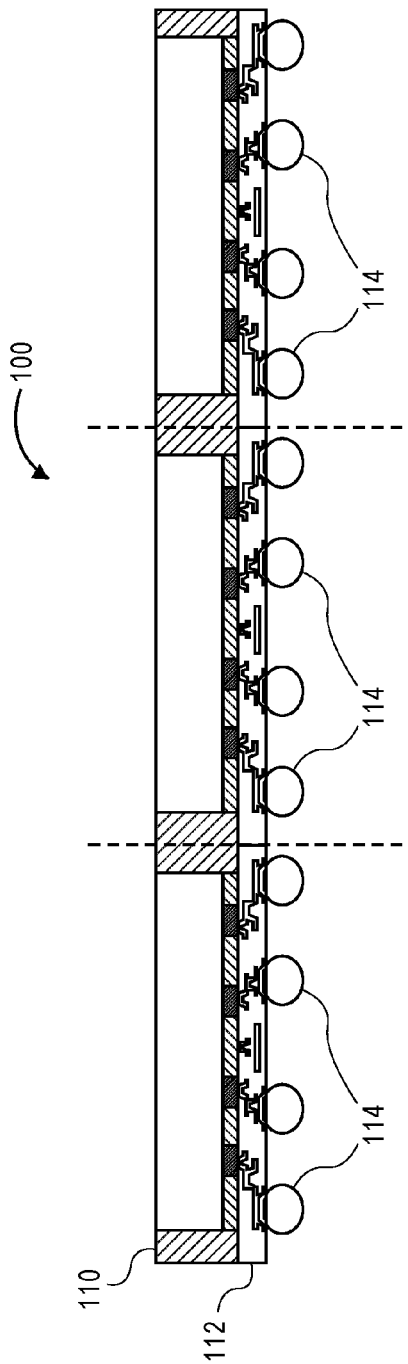
FIG. 2G
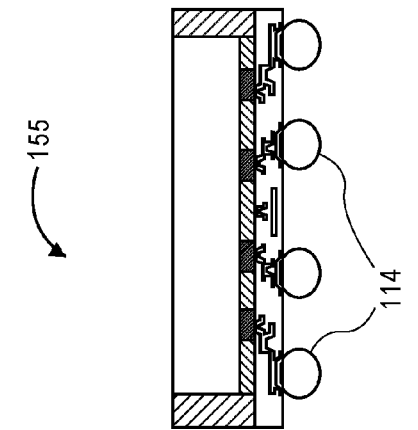
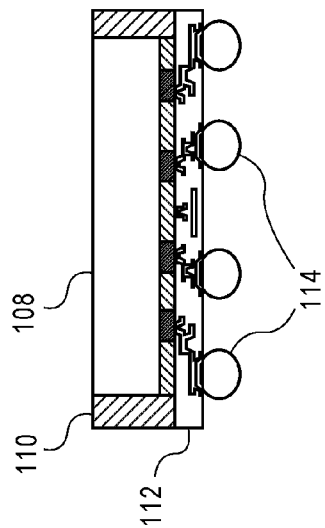
FIG. 2H

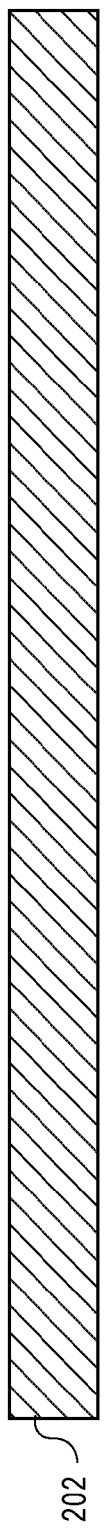
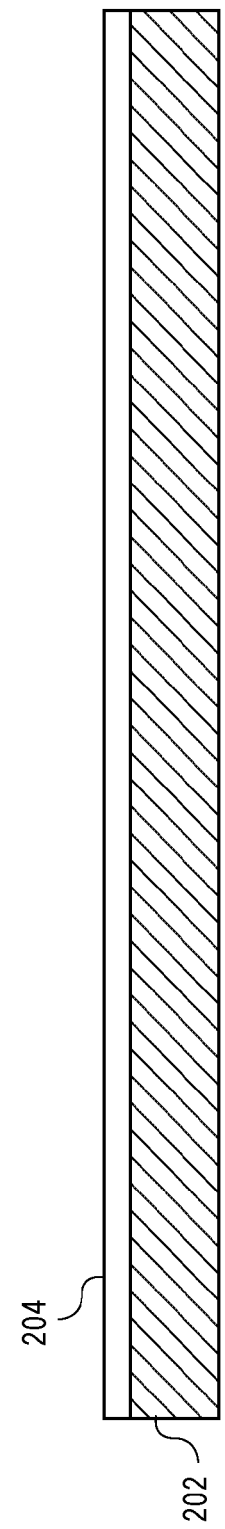

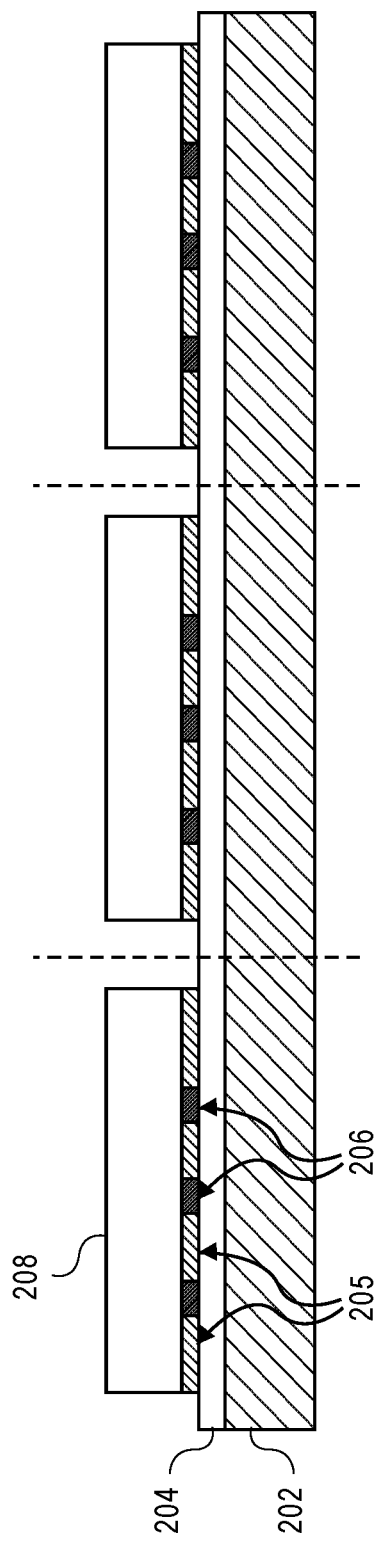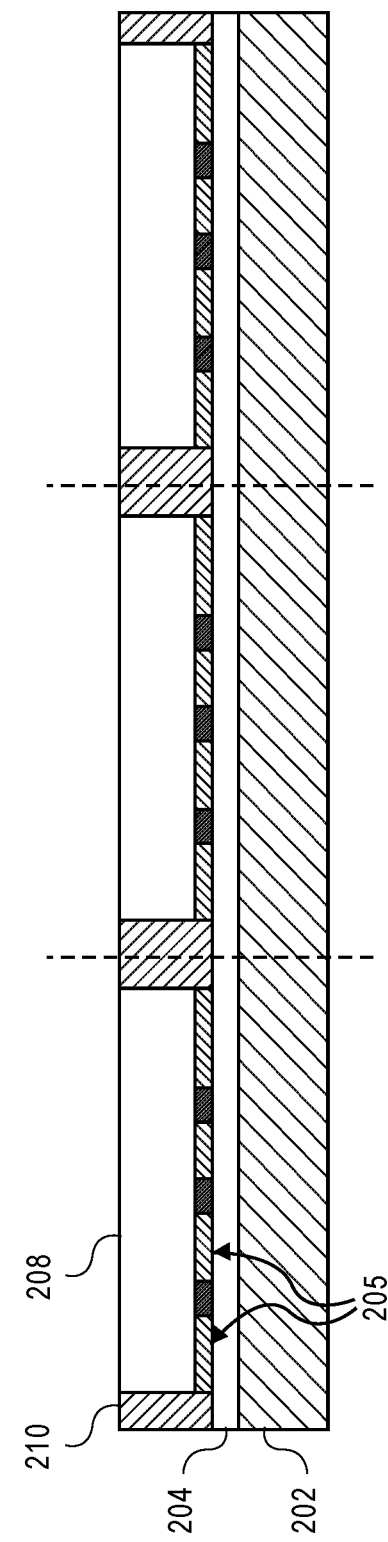

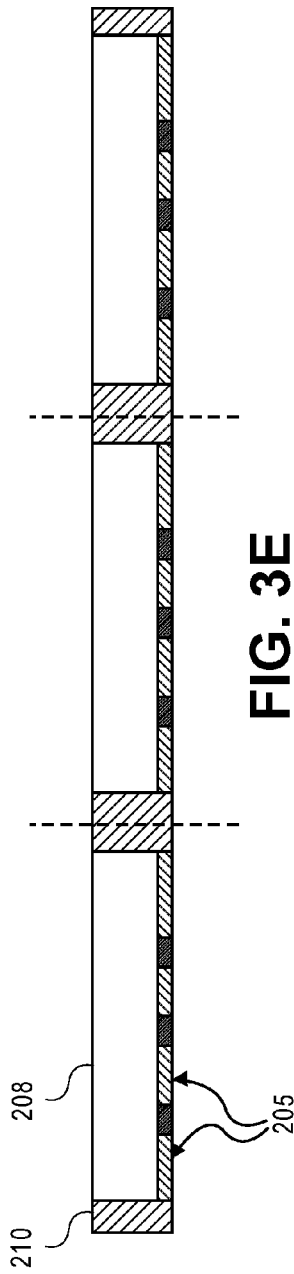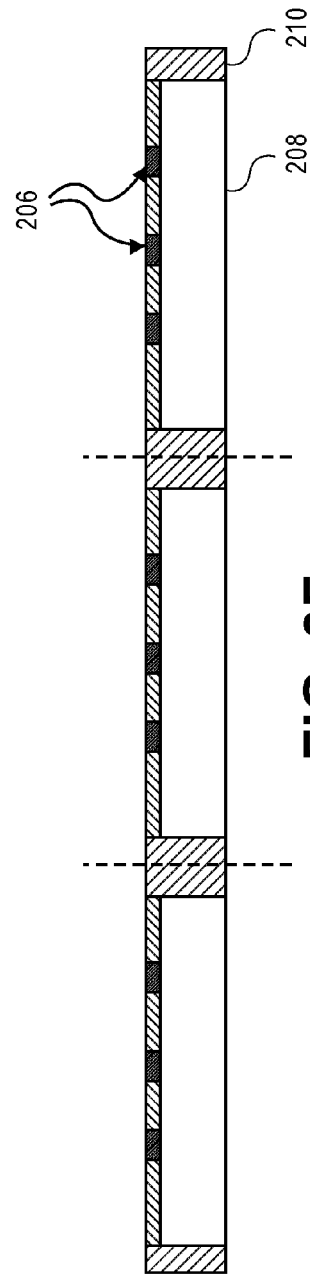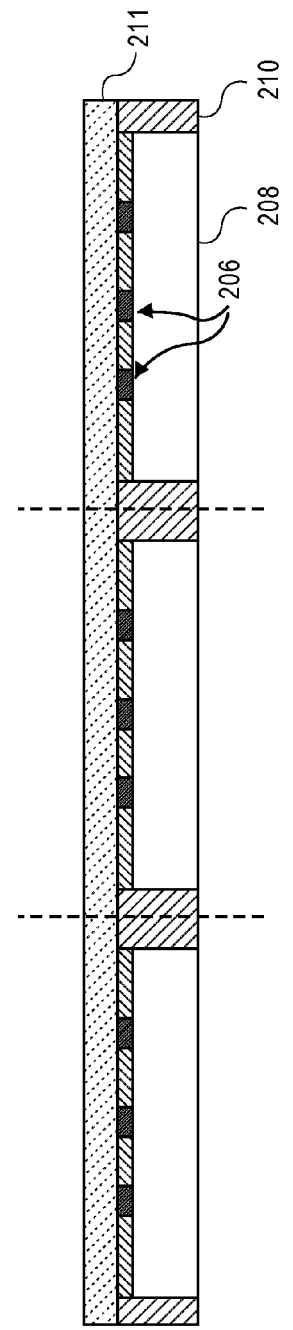

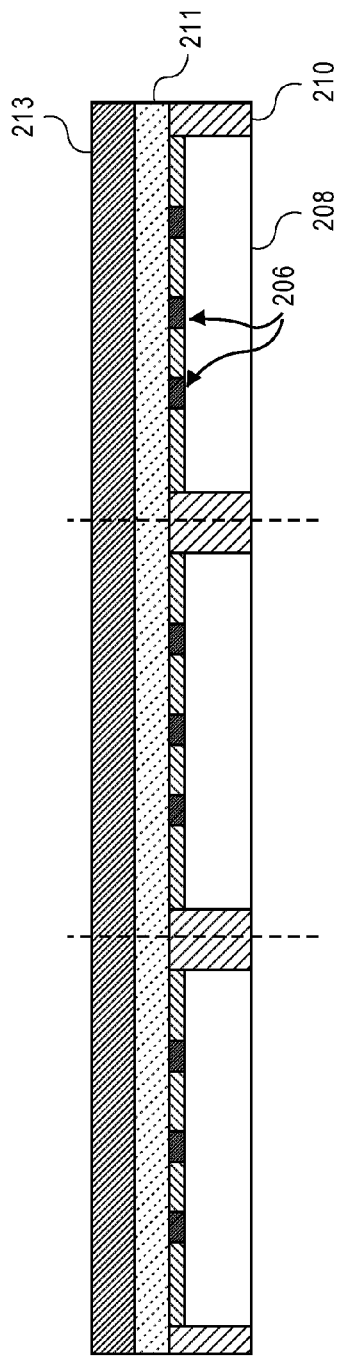
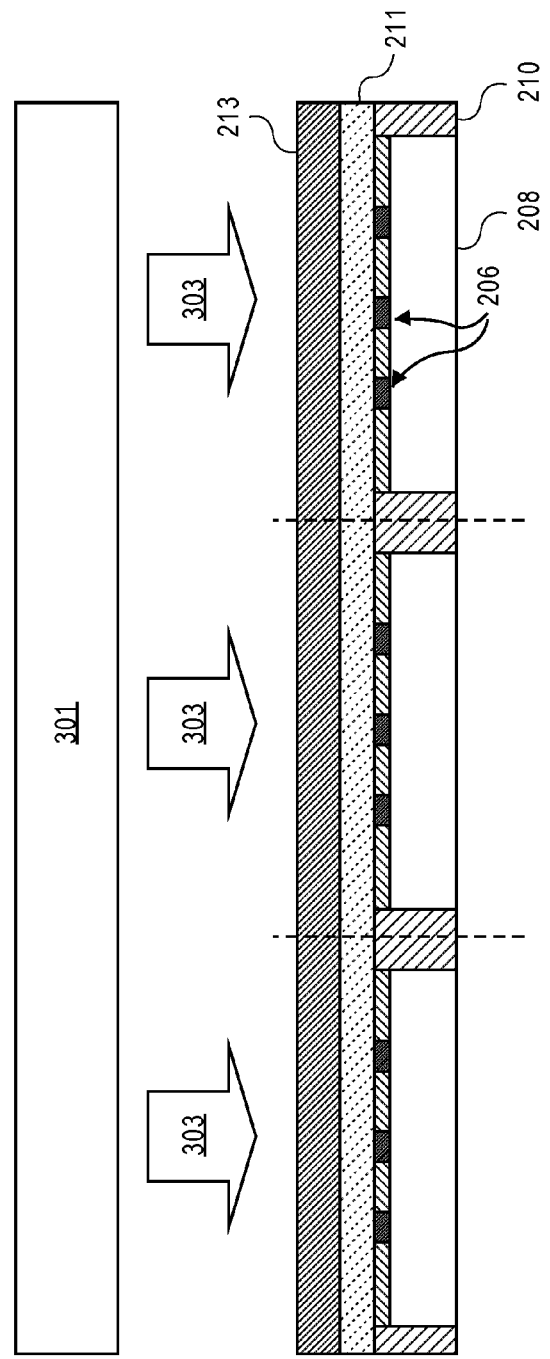

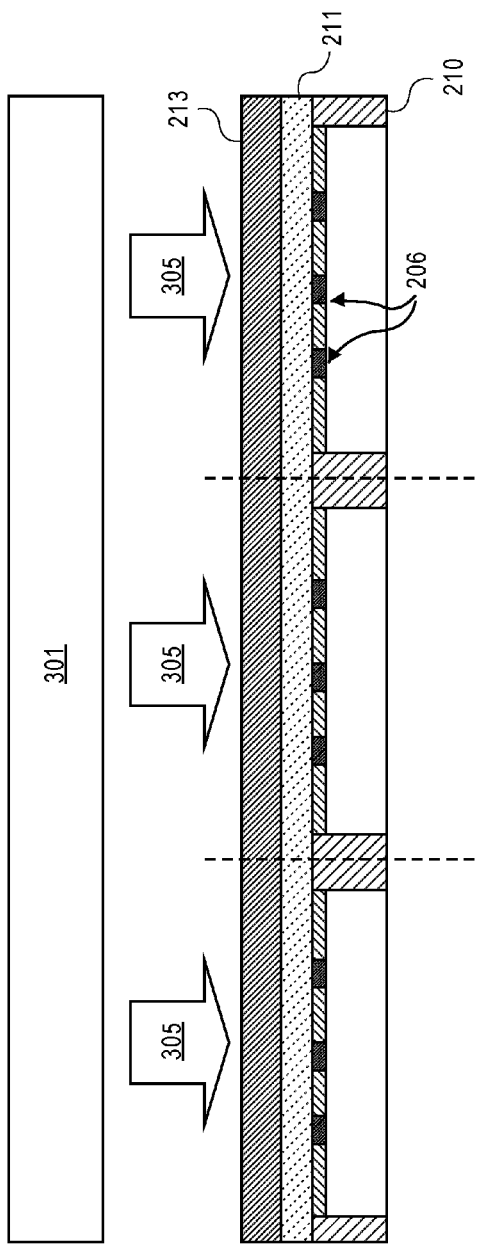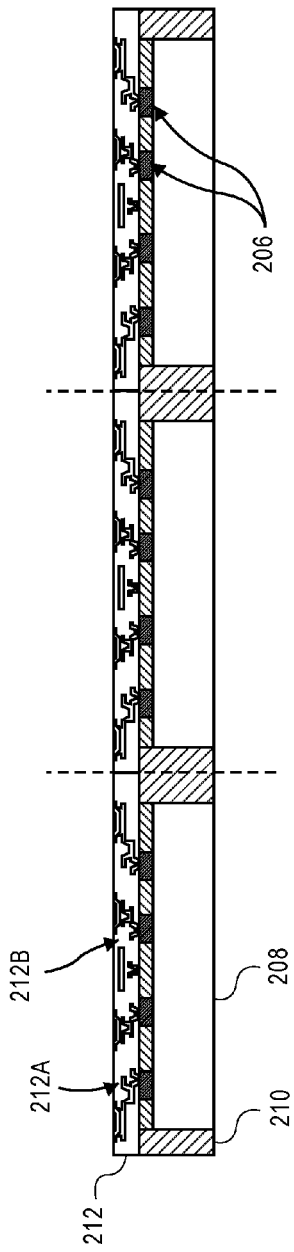

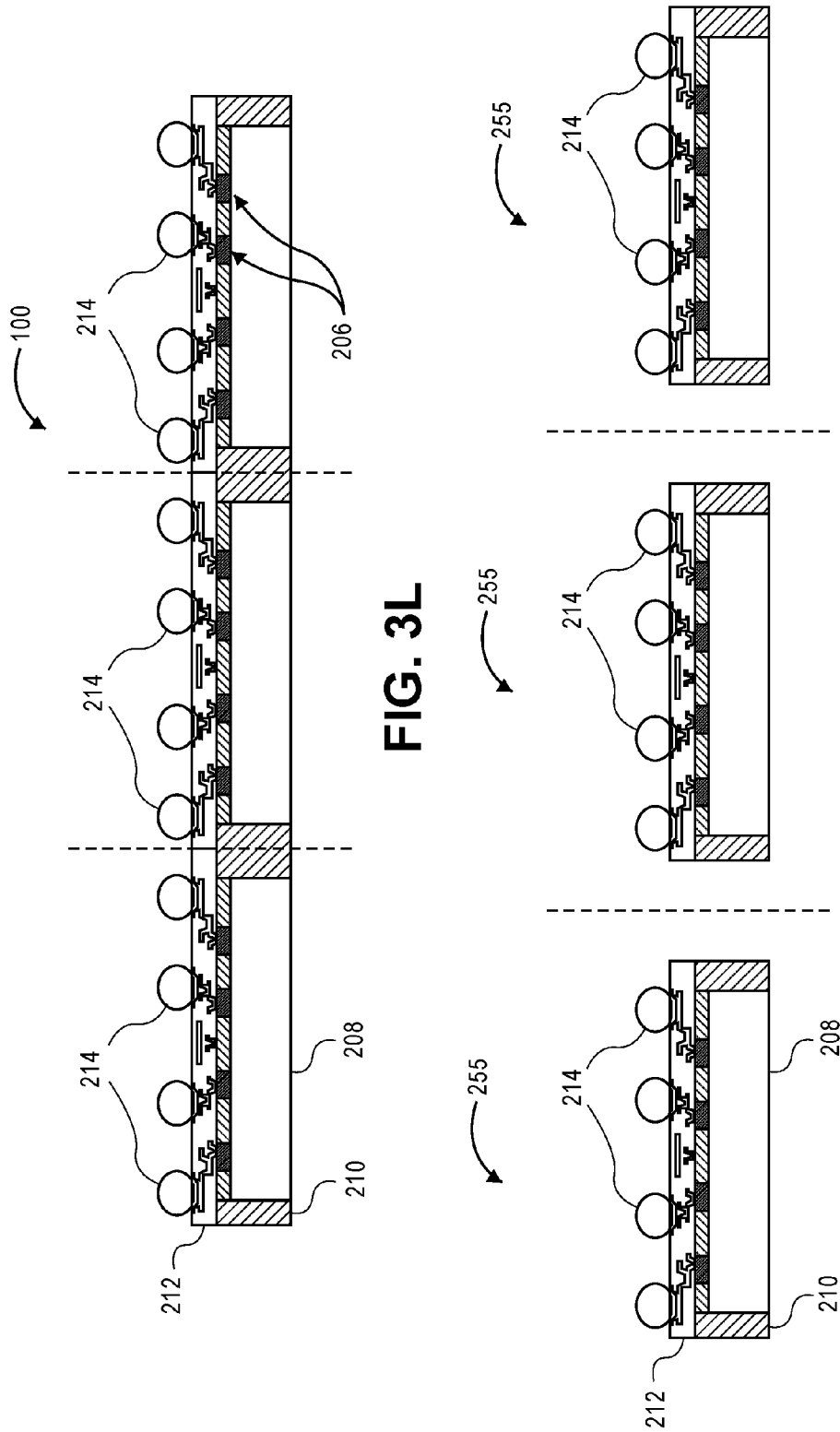

HYBRID EXPOSURE FOR SEMICONDUCTOR DEVICES

FIELD

Embodiments generally relate to semiconductor devices. More specifically, embodiments relate to methods, systems, and apparatuses for packaging semiconductor dies.

BACKGROUND INFORMATION

Packaging technologies, such as embedded wafer level ball grid array (eWLB), embedded panel level ball grid array (ePLB), or Bumpless Build-Up Layer (BBUL) technology, generally involve encapsulating semiconductor dies in a molding compound to create a fan-out area, and subsequently building material layers over the encapsulated semiconductor dies and the fan-out area. One such material layer is known as a redistribution layer (RDL). The RDL that is built over the encapsulated die and the fan-out area enables the semiconductor package to have a higher input/output (I/O) count than would be available without the RDL and the fan-out area. Specifically, the higher I/O count is achieved by connecting the RDL that is formed over the encapsulated semiconductor dies to I/O pads (also known as contact pads) of the encapsulated semiconductor dies.

Undesirable die movement (e.g., die rotation, die shifting, etc.) can occur due to processing operations performed during formation of a package that includes a fan-out area. This undesirable die movement may cause problems when aligning subsequently formed material layers, such as the RDL. These problems can be pronounced in multi-chip packages, where two or more semiconductor dies are packaged together in a single package. Die movement is undesirable because it can result in reduced yields—for example, die movement can make it difficult to accurately connect the RDL to the contact pads of encapsulated semiconductor dies.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIGS. 2A-2H are cross-sectional side view illustrations of a method of forming a semiconductor package that includes a fan-out area according to one or more embodiments.

FIGS. 3A-3M are cross-sectional side view illustrations of a method of forming a semiconductor package that includes a fan-out area according to one or more embodiments.

DETAILED DESCRIPTION

Figure 1:
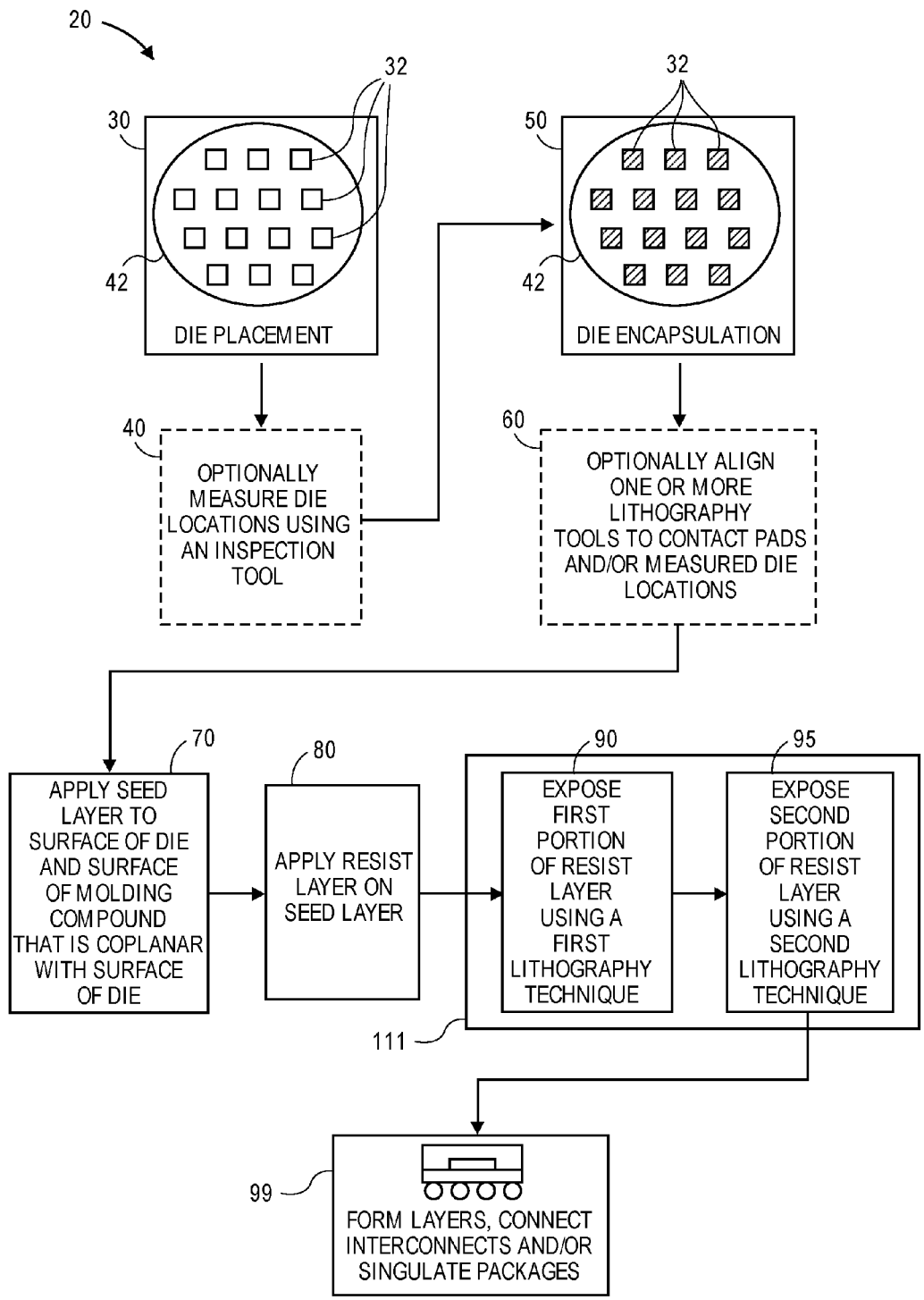
FIG. 1 is a schematic view of a process for fabricating semiconductor dies according to one or more embodiments.

Embodiments described herein provide methods, systems, and apparatuses that can assist with reducing the negative effects of die movement resulting from processing operations performed during package formation.

For one aspect, embodiments integrate a hybrid exposure operation into a process of forming semiconductor packages. As used herein, a "hybrid exposure operation" and its variations refer to the act of exposing of a resist layer (e.g., a photoresist layer) using at least two different lithography exposure operations. For example, a hybrid exposure operation includes a first exposure operation for exposing a first portion of a resist layer and a second exposure operation for exposing a second portion of the resist layer, where the first and second exposure operations are different from each other. In this example, the first operation is performed using a photolithography process based on a mask and the second operation is performed using digital imaging lithography (e.g., laser direct imaging technology) or maskless lithography. The first portion can include a first area of the resist layer to be used for forming one or more material layers (e.g., an RDL, etc.) without including a second area of the resist layer to be used for forming an electrical communications pathway between at least one of the I/O pads (contact pads) of the encapsulated semiconductor die and the material layer(s). Furthermore, and in this example, the second portion includes the second area of the resist layer that includes the electrical communications pathway. Thus, during formation of a semiconductor package, this hybrid exposure operation may allow for increased accuracy when forming electrical communications pathways (electrical connections) between contact pads of encapsulated semiconductor dies and one or more material layers (e.g., an RDL) that are formed over the encapsulated dies and the package's fan-out area. Consequently, the hybrid exposure operation may allow for reductions to costs of chip scale packaging, wafer-level packaging, 3-D packaging, and system-in-package (SiP) solutions that require redistributed bond pads.

For one embodiment, a process of forming semiconductor packages with a hybrid exposure operation includes encapsulating a semiconductor die with a molding compound and applying a seed layer on the die and the molding compound. A surface of contact pads of the die may be coplanar with a surface of the molding compound (e.g., the fan-out area). As used herein, "coplanar objects," "coplanar surfaces," "coplanar points," and their variations refer to at least two objects that lie in the same plane (e.g., the x-y plane, the z-plane, etc.). For example, two surfaces are coplanar surfaces with respect to the x-y plane, even though each of the two surfaces are at different locations with respect to the z-plane. Thus, two coplanar surfaces can be parallel with each other even though the surfaces have different z-heights.

The seed layer may be applied on the surface of the molding compound (e.g., the fan-out area) that is coplanar with the surface of the contact pads on each of the semiconductor dies. For an alternate embodiment, a dielectric layer is deposited on a surface of the die and a surface of the molding compound, where the surface of the die and the fan-out area created by the molding compound are coplanar with each other. The dielectric layer can act as a stress buffer that assists with reducing or eliminating stress-induced damage to the contact pads of the semiconductor die. To achieve this function, the dielectric layer can be a conductive material having at least one of a Young's modulus, a hardness, a strength, or a toughness that is great enough to protect the contact pads. For this alternate embodiment, the dielectric layer may be deposited on top of a metal layer and/or other layers (e.g., protection layers, etc.), where each of the at least one metal layer and/or the other layers is deposited on the die and the molding compound before or after application of the dielectric layer. Furthermore, and for this alternate embodiment, the dielectric layer is deposited before the seed layer is deposited, such that the seed layer is applied on a top surface of the dielectric layer. The dielectric layer may be structured before the seed layer is applied on the dielectric layer. For example, the dielectric layer may be opened in areas where contact pads of the semiconductor die are located. For this alternate embodiment, the process further includes depositing the seed layer on the top surface of the dielectric layer and/or the underlying surfaces of the contact pads exposed by the openings in the dielectric layer.

The seed layer may be made of a suitable metal or metal alloy. The seed layer may be deposited by using, for example, sputtering, electroless deposition, evaporation or any other appropriate technique. For one embodiment, the seed layer may consist of an adhesion promoter/diffusion barrier layer and a layer providing electrical conductivity. For example, the seed layer may be composed of two thin metal layers stacked on each other, where a bottom one of the two layers is the adhesion promoter/diffusion barrier layer and a top one of the two layers is the layer providing electrical conductivity.

The process further includes applying a resist layer on the seed layer, exposing a first portion of the resist layer, and exposing a second portion of the resist layer. For one embodiment, the first portion includes a first area of the resist layer to be used for forming a redistribution layer (RDL) without including a second area of the resist layer to be used for forming an electrical communications pathway between at least one of the contact pads and the RDL. For a further embodiment, the second portion includes the second area of the resist layer that includes the electrical communications pathway. For yet another embodiment, each of the first and second exposure operations are performed using exposure operations that are different from each other. For example, the first operation is performed using a lithography process based on a mask, and the second operation is performed using digital imaging lithography or maskless lithography.

FIG. 1 is a schematic view of a process 20 for fabricating semiconductor dies according to one embodiment. Process 20 begins at operation 30 where semiconductor dies 32 are picked up from a wafer (not shown) and placed on a carrier 42 to form a reconfigured wafer 42. For one embodiment, dies 32 are placed on the carrier 42 in a fan-out pattern in which one die 32 is spaced apart from a neighboring die 32. Picking and placing dies 32 onto carrier 42 has the potential to misalign, misplace, rotate, or translate the dies 32 out of uniform alignment. The variation in the alignment can undesirably affect electrical connection and electrical performance of the dies 32. In some situations, it may be desirable to determine the position of each die 32 or smaller groups of dies 32 prior to opening the contact pads on the dies 32 for electrical connection to one or more material layers that are formed on or over the dies 32. The contact pads on the dies 32 can be one or more layers of conductive material, such as aluminum (Al), copper (Cu), tin (Sn), nickel (Ni), gold (Au), or silver (Ag).

At optional operation 40, the location of each die 32 on carrier 42 is measured. For one embodiment, the die locations are measured optically and stored in an electronic or digital format. An inspection tool can be used to determine the location of each die 32 on carrier 42. For example, the inspection tool is a scanner (not shown) that is configured to measure the positions of semiconductor dies 32, process the measured position data (e.g., calculating an exposure matrix), and provide this data to one or more lithography tools. For one embodiment, the scanner is in electrical communication with a computer (not shown) operating software that is configured to store the measured position data of each die 32, process the measured position data (e.g., calculating an exposure matrix), and communicate this information to one or more lithography tools. The computer can be any computer including any suitable memory and the computer can be configured to operate computer executable functions. Alternatively, the computer can be a specially designed computer constructed to store the measured position data of each die 32, process the measured position data (e.g., calculating an exposure matrix), and communicate this information to one or more lithography tools. Examples of lithography tools include, but are not limited to a stepper, a mask aligner, a digital imaging apparatus, a laser direct imaging (LDI) device, a laser assembly, and a maskless lithography apparatus.

For one embodiment, each die 32 includes one or more marks (e.g., located on two corners of each die 32) that can be detected by the inspection tool. For a further embodiment, the inspection tool calculates the amount of rotation or misplacement of each of the dies 32 to measure and calculate the relative positions of each die 32. For one embodiment, the inspection tool measures the relative and individual location of each die 32 on carrier 42. For one embodiment, the inspection tool measures and records the relative location of multiple dies 32 (for example between 8-20 dies) in a stepfield group. After measuring the relative position of the multiple dies 32, the inspection tool, for one embodiment, calculates an optimum exposure position for each of the dies 32 in one stepping field of the stepper and for all stepping positions and transfers this information to one or more lithography tools. Operation 40 is optional.

For one embodiment of operation 40, a high speed inspection tool is used to detect the actual position of each encapsulated die 32 after the molding compound has cured. Alignment marks on die 32 or the die structure formed after the encapsulation can be used for the measurement. The data can be stored and used for multiple alignment steps of a combined alignment procedure and for the different layers of a package (e.g. dielectric layers, RDLs, solder stop, etc.). From the measured data, an optimized alignment stepping position and procedure can be calculated for one or more lithography tools (e.g., a mask aligner, a stepper, a laser direct imaging (LDI) device, etc.).

At operation 50, each die 32 is encapsulated with a molding compound to form encapsulated dies 32 (as illustrated by the hatching pattern shown in FIG. 1). As used herein, "encapsulating" does not require all surfaces of a die 32 to be encased within a molding compound. For a first example, the lateral sides of a die 32 are encased in a molding compound such that the molding compound is not formed over the bottom surface of the die 32, where the bottom surface includes the contact pads of the die 32. As a second example, the lateral sides of a die 32 are encased in a molding compound such that the molding compound is not formed over the top and bottom surfaces of the die 32, where the bottom surface includes the contact pads of the die 32 and the top surface does not include the contact pads of the die 32. The amount of molding compound can be controlled to achieve a specified height. Furthermore, additional encapsulation operations may be subsequently performed in order to provide chemical and mechanical protection to one or more surfaces of a die 32. Alternatively, an amount of the molding compound can be removed after application in order to expose one or more surfaces of the die 108.

Encapsulating each die 32 with a molding compound can shift or displace the location of the respective die 32 on carrier 42. The molding compound can be encapsulated over one or more dies 32 using at least one of a transfer molding process or a compression molding process. The molding compound can include polymer material, epoxies, or other suitable insulating and/or dielectric materials.

Each of operations 30 and 50 are just a few causes of undesirable movement of one or more encapsulated dies 32, such that the positions of encapsulated die(s) 32 are different from the initial positions of die(s) 32. Undesirable die movement is generally the result of multiple contributors: (i) the pick & place accuracy (depending on equipment capability and alignment strategy); (ii) the chemical shrink of the molding compound with respect to embedding materials; (iii) the die and package dimensions; and (iv) differing coefficients of thermal expansion (CTEs) of the various materials used in the package formation process (e.g., carrier, adhesive, stress release film, silicon, mold compound, etc.). Some of these contributors cannot be influenced easily—for example, the chemical shrink of a mold compound during curing is not constant over the complete mold area and the CTE of a cured mold compound is also not constant over the entire substrate. In theory, it may be possible to control die and package dimensions; however, the need to increase I/O counts and reduce packaging costs may prevent this contributor from being easily controlled. The pick and place process is one area that may be easily controlled. Nevertheless, maintaining or even improving the accuracy of the pick & place process during package formation can also be a difficult challenge. For example, the pick & place process can be performed using local alignment—i.e., a die bonder is aligned on an alignment mark for accurate placement of a semiconductor die. This local alignment, however, can slow down the pick & place process and lead to increased costs. Specifically, local alignment requires applying alignment marks to dies and installing die bonders in parallel in a production line.

Referring now to optional operation 60 of FIG. 1, one or more lithography tools or devices (as described above) that will be used for lithographically exposing elements of a semiconductor package including an encapsulated die 32 can be aligned using at least one of the locations of the contact pads of the encapsulated die 32 or measured information acquired at optional operation 40. As a first example, and for one embodiment, the lithography tool(s) can be aligned based on the exact location of the contact pads of the encapsulated die 32 after the molding compound has been cured and the carrier 42 has been removed. As a second example, and for one embodiment, the lithography tool(s) can be aligned based on the measured position data that was described above in connection with optional operation 40 while taking die shift compensation into account. A combination of these two examples is possible.

Examples of lithography tools or devices include a photolithographic stepper or mask aligner that is used in conjunction with a mask, a laser direct imaging (LDI) tool that can be used with or without a mask, etc. Elements of a semiconductor package include, but are not limited to, contact pads, conductive traces, dielectric layers, and Under-Bump Metallization (UBM) layers. Operation 60 is optional, as indicated by the dotted lines shown in FIG. 1.

At operation 70, a seed layer is applied to a surface of the dies 32 that is coplanar with a surface of the molding compound. In particular, the surface of the dies 32 that is coplanar with the surface of the molding compound includes surfaces of one or more contact pads of dies 32 that are coplanar with the surface of the molding compound. For one embodiment, the seed layer is made up of one or more metallic seed layers that are deposited on the surface described above. Further, and in operation 80, a plating resist layer is deposited over the seed layer. Other layers (e.g., a passivation layer, etc.) as are known in the art can be applied in operations 70 and/or 80. For an embodiment, applying the seed layer, the resist layer, or any other layer (e.g., a passivation layer, etc.) includes knowledge of the exact locations of the exposed contact pads of each encapsulated die 32 for operations 90, 95, and 99 described below.

At operation 90, a first portion of the resist layer is exposed using a first lithography technique. For one embodiment of operation 90, at least one of the lithography tools described above is aligned using the locations of the exposed contact pads of the encapsulated die after the molding compound has been cured and the carrier 42 has been removed. For example, operation 90 can be performed using a photo mask that is positioned over the resist layer, and the resist layer is exposed through the mask to a light source (e.g., a stepper or a mask aligner) for a prescribed period, so that some portions of the resist layer are exposed while other portions are prevented from being exposed by the image of the mask. In this embodiment, operation 90 does not include exposing portions of the resist layer that include one or more electrical communications pathways from the exposed first portion to the contact pads of the encapsulated die 32. For a further embodiment, operation 90 can be performed using the measured position data locations of optional operation 40 and the alignment of optional operation 60.

Referring now to operation 95, a second portion of the resist layer is exposed using a second lithography technique that is different from the first lithography technique. For one embodiment of operation 95, at least one of the lithography tools described above is aligned using the locations of the exposed contact pads of the encapsulated die after the molding compound has been cured and the carrier 42 has been removed. For example, operation 95 can be performed using a direct imaging apparatus, such as a laser direct imaging (LDI) tool that is positioned over the resist layer with or without a mask. In this example, the resist layer is exposed to a light source of the digital imaging apparatus for a prescribed period, so that some portions of the resist layer are exposed while other portions are prevented from being exposed by the image of the mask (or image data if no mask is used). In this embodiment, operation 95 is used to expose portions of the resist layer that include one or more electrical communications pathways from the exposed first portion to the contact pads of the encapsulated die 32. For a further embodiment, operation 95 can also be performed using the measured position data locations of optional operation 40 and the alignment of optional operation 60.

Each of operations 90 and 95 collectively form a hybrid exposure operation 111. The first exposure operation 90 enables the exposure of the main parts of any material layers (e.g., one or more RDLs) formed on the encapsulated die 32 and the fan-out area to be performed quickly and without the need for extensive alignment operations, while the second exposure operation 95 enables accurate exposure of the electrical connections from the contact pads of the encapsulated die 32 so as to ensure proper formation of electrical communications pathways between the contact pads and the formed material layers (e.g., one or more RDLs).

For one embodiment, the first exposure operation 90 is performed using photolithography implemented by a photolithography stepper or a mask aligner. Furthermore, and in this embodiment, the second exposure operation 95 is performed using digital imaging lithography and/or maskless lithography, which may be slower and more precise than the photolithography of operation 90. In this way, the hybrid exposure operation 111 can assist with reducing the costs of performing the entire exposure of the resist layer with digital imaging lithography and/or maskless lithography. Furthermore, the more precise and slower digital imaging lithography and/or maskless lithography can be combined with the comparatively faster and more imprecise photolithography to form more accurate connections between contact pads of encapsulated semiconductor dies 32 and material layers (e.g., one or more RDLs).

In some embodiments, the hybrid exposure operation 111 is not limited to forming connections between contact pads and material layers (e.g., one or more RDLs), but can also be used for forming connections between multiple material layers (e.g., a first RDL and a second RDL within a single package) and/or for forming connections between multiple dies (e.g. a first die 32 and a second die 32).

In at least one embodiment, the hybrid exposure operation 111 can assist with the following: (i) reducing costs of packing semiconductor devices because of reduced failure rate of electrical connections between material layers and contact pads of semiconductor dies; (ii) performing faster and more precise lithography on large panels or wafers with die shift compensation; (iii) forming finer line spaces between RDLs because digital imaging lithography is used (as opposed to using a stepper or a mask aligner that is not as precise an digital imaging tool); (iv) performing lithography inline using multiple pieces of equipment, which would provide high throughput by reducing the number of times expensive lithography or inspection equipment is used; (v) performing lithography in a manner that is faster than using digital imaging lithography alone; (vi) providing a better solution to undesirable die movement given that die shift compensation cannot be used after undesirable die movement exceeds a predetermined threshold; (vii) reducing the need to have highly accurate pick and place apparatuses or die bonders, even for high sophisticated front-end technologies that require tight pitches and small pad sizes (e.g., 10 nm, 7 nm front-end technology); (viii) enabling use of faster die bonders given the reduced need for accuracy of these types of equipment; (ix) removing the need to use an inspection tool to locate specific locations of encapsulated dies given that the alignment of the lithography devices used in the first and second exposure operations can be performed separately; and (x) reducing resources required to determine die location when an inspection tool is used because the die location data can be re-used for exposure of multiple layers.

At operation 99, the resist layer is processed to remove the exposed first and second portions of the resist layer, which in turn exposes the surface of the seed layer at those locations. The substrate (which is made up of the dies 32 and the molding compound) can be subjected to a plating process, during which a thick layer of metal is plated onto the seed layer in the locations where it is not covered by the resist layer. The resist layer is then removed leaving the plated metal layer in the form of the image. Finally, a chemical etch is performed, during which portions of the metal are dissolved. The timing of the etch process is sufficient to remove the entire thickness of the seed layer, where it was covered during plating step by the resist, but that removes only a small portion of the thick plated metal material. In this way, one or more material layers (e.g., one or more RDLs) and corresponding interconnects (e.g., one or more solder bumps) are formed. Each of the processes performed at operation 99 is one of many different processes by which a feature or layer can be formed, and in many cases, the selection of one process over another is merely a design choice, where any of several processes would be satisfactory. In other cases, selection of the process is influenced by factors such as, e.g., materials involved, cost, scale, etc. Because such processes are well known and understood, they will not be described in detail where the choice of process is not material to the disclosure.

FIGS. 2A-2H are cross-sectional side view illustrations of a method of forming a semiconductor package that includes semiconductor dies 32 and a fan-out area according to one or more embodiments. The semiconductor packages formed using the method of FIGS. 2A-2H can be wafer level packages (WLP) or panel level packages (PLP). Referring to FIG. 2A, the process of forming the semiconductor package can begin with a carrier substrate 102, e.g., a silicon wafer, a glass wafer, a metal carrier etc. Referring to FIG. 2B, an adhesive layer 104 is applied on the carrier substrate 102. For example, the layer 104 is a temporary adhesive, e.g., a polyimide adhesive, a polymeric bonding agent, adhesive tapes, etc.

Referring to FIG. 2C, a plurality of dies 108 is transferred to the adhesive layer 104 using a suitable technique such as a pick and place machine. As explained above in connection with FIG. 1, the transfer of the dies 108 can lead to undesirable die movement (e.g., die rotation, die shift, etc.). Furthermore, an exemplary die 108 can include a passivation layer 105 and exposed contact pads 106.

Referring now to FIG. 2D, the plurality of dies 108 is encapsulated in a molding compound 110 on the adhesive layer 104. Furthermore, and as described above in connection with FIG. 1, the encapsulation of the dies 108 with the molding compound 110 can cause undesirable die movement.

The temporary adhesive layer 104 and carrier substrate 102 may then be removed after application of the molding compound resulting in a plurality of embedded dies 108 with exposed contact pads 106, as illustrated in FIG. 2E. For one embodiment of FIG. 2E, after the removal of the adhesive layer 104 and the carrier 102, the locations of the exposed contact pads 106 are measured and stored for use in FIG. 2F.

Referring now to FIG. 2F, a redistribution layer (RDL) 112 is formed over the bottom side of dies 108 (having exposed contact pads 106) and the molding compound 110. For one embodiment, the formation of the RDL 112 is performed in accordance with process 20 of FIG. 1, which is described above. For one embodiment, formation of the RDL 112 includes use of at least one of a dielectric layer, a seed layer, or a resist layer (e.g., a photoresist layer). For a first example, a dielectric layer is applied on the bottom side of dies 108 (having exposed contact pads 106) and the molding compound 110. For this first example, openings can be formed in the dielectric layer to reveal surfaces of the exposed contact pads 106. In addition, and for this example, a seed layer is subsequently applied on the dielectric layer and its corresponding openings. Moreover, and for this first example, a resist layer is applied on the seed layer and the resist layer is patterned to form the RDL 112. For a second example, the seed layer is applied on the bottom side of dies 108 (having exposed contact pads 106) and the molding compound 110. For this second example, the dielectric layer is not applied. Furthermore, and for this second example, the resist layer is applied on the seed layer and subsequently patterned to form the RDL 112. It is to be appreciated that other types of layers can be involved in the formation of the RDL 112—for example, one or more metal layers or protection layers can be applied to the bottom side of dies 108 (having exposed contact pads 106) and the molding compound 110 before or after application of at least one of a dielectric layer, a seed layer, or a resist layer (e.g., a photoresist layer). For the sake of brevity, these other layers are not described in detail.

For one embodiment, the RDL 112 includes one or more redistribution lines 112A, openings for interconnects 112A, and passivation layers 112B that are electrically connected to the contact pads 106. For one embodiment, the one or more redistribution lines 112A and openings for interconnects 112A are connected to contact pads 106 via at least one electrical communications pathway that is formed in accordance with the process 20 of FIG. 1 as described above. The material of the one or more redistribution lines and openings for interconnects 112A are can be formed from a metallic material such as: copper (Cu); titanium (Ti); nickel (Ni); gold (Au); a combination of at least one of Ti, Ni, Au, or Cu; or other suitable metals, alloys, or combinations of metals and/or alloys. A passivation layer can be any suitable insulating materials such as an oxide, or polymer (e.g. polyimide). For an embodiment, one or more redistribution lines 112A and openings for interconnects 112A are formed one die 108 and compound 110 to be electrically connected to the exposed contact pads 106 of die 108 using a suitable technique such as sputtering, followed by etching. An RDL 112 including multiple redistribution lines 112A, openings for interconnects 112A, and passivation layers 112B can be formed using the process 20 that is described above in connection with FIG. 1, a sequence of deposition, and a sequence of patterning that results in the structure illustrated in FIG. 2F.

Referring now to FIGS. 2G-2H, a first plurality of interconnects 114 (e.g., conductive bumps) is formed on a bottom side of the RDL 112, and the wafer level stack 100 is singulated along the dotted lines to obtain individual semiconductor packages 155. For one embodiment, the interconnects 114 are plated on the bottom side of the RDL 112 such that each of interconnects 114 extends out of the RDL 112. In the illustrated embodiment, a gap exists between each interconnect 114. The plurality of interconnects 114 can be more than four conductive bumps or less than four conductive bumps. The plurality of interconnects 114 can take a shape other than a bump. For example, at least one of the interconnects 114 is a conductive pillar. For one embodiment, the interconnects 114 can be made of a metallic material such as: copper (Cu); titanium (Ti); nickel (Ni); gold (Au); a combination of at least one of Ti, Ni, Au, or Cu; or other suitable metals, alloys, or combinations of metals and/or alloys.

Figure 2I:
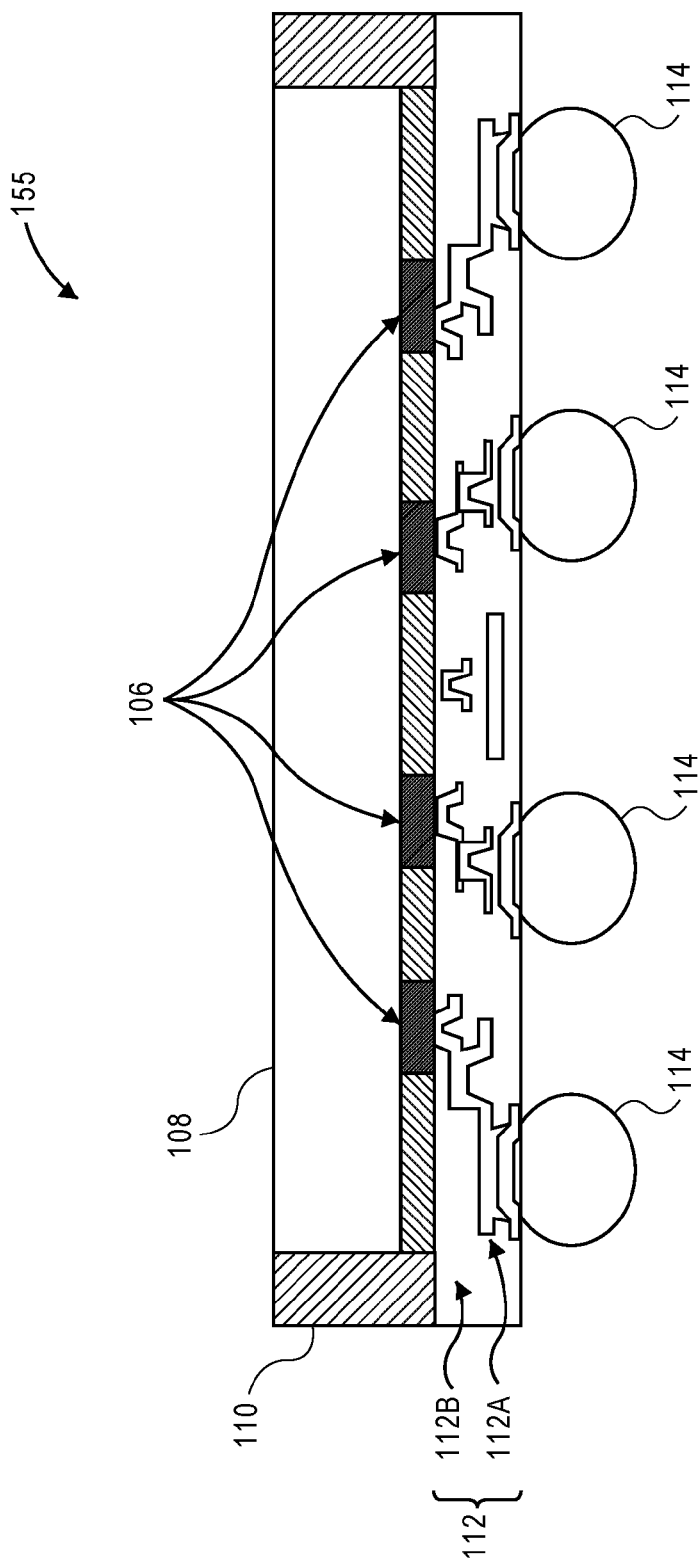
FIG. 2I is a detailed cross-sectional side view illustration of a singulated semiconductor package created in accordance with the method described in FIGS. 2A-2H.

Referring now to FIG. 2I, a detailed cross-sectional side view illustration is provided of a singulated semiconductor package 155 that is created in accordance with the process described above in FIGS. 2A-2H. For one embodiment, each semiconductor package 155 includes an RDL 112, a semiconductor die 108 on a top side of the RDL 112, and a molding compound 110 encapsulating the die 108 on the RDL 112. A plurality of interconnects 114 (illustrated in FIG. 2I as conductive bumps) that additionally extend from a bottom side of the RDL 112. The RDL 112 may be formed on the bottom side of the die 108 and the molding compound 110. For one embodiment, the RDL is formed in accordance with the process 20 that is described above in connection with FIG. 1.

In the illustrated embodiment of FIG. 2I, only one die 108 is shown. More than one die 108 can be included in the package 155. Furthermore, the package 155 can be a package-on-package (PoP) application that includes multiple packages stacked on top of each other.

For an embodiment, the RDL 112 includes one or more redistribution lines 112A, openings for interconnects 112A, and one or more passivation layers 112B. For a further embodiment, each redistribution line 112A is electrically connected to one or more contact pads 106 of the die 108 using a process that includes a hybrid exposure operation, e.g., the hybrid exposure operation 111 described above in connection with FIG. 1. For an embodiment, the RDL 112 has a thickness of less than 50 µm. For example, the RDL has a thickness ranging from 20 µm-50 µm.

FIGS. 3A-3M are cross-sectional side view illustrations of a method of forming a semiconductor package that includes a fan-out area according to one or more embodiments. Referring to FIGS. 3A-3B, the process of forming a semiconductor package can begin with a carrier substrate 202 and adhesive layer 204, e.g., similar to or the same as carrier substrate 102 and adhesive layer 104 described above in FIGS. 2A-2I. Referring to FIG. 3C, a plurality of dies 208 is transferred to the adhesive layer 204 using a suitable technique such as a pick and place machine. As shown, an exemplary die 208 includes a passivation layer 205 and exposed contact pads 206. Note that the picking and placement of the dies 208 can cause undesirable die movement.

Referring now to FIG. 3D, the plurality of dies 208 is encapsulated in a molding compound 210 on the adhesive layer 204. The encapsulation of dies 208 using molding compound 210 can be similar to or the same as the encapsulation of dies 108 using molding comping 110 as described above in connection with FIGS. 2A-2I. The molding compound 210 can be different from or the same as the molding compound 110 described above in connection with at least one of FIGS. 1-2I. The encapsulation of the dies 208 with the molding comping 210 can cause undesirable die movement.

In FIG. 3E, the adhesive layer 204 and carrier substrate 202 may then be removed after application of the molding compound resulting in a plurality of embedded dies 208 with exposed contact pads 206, similar to or the same as operations described above in connection with FIG. 2E. For one embodiment of FIG. 3E, after the removal of the adhesive layer 204 and the carrier 202, the locations of the exposed contact pads 106 are measured and stored for use in FIGS. 3F-3I. The locations can be measured using an inspection tool and stored in one or more computers that are in communication with one or more lithography tools, as described herein.

Referring now to FIG. 3F, the substrate formed from the encapsulation of dies 208 with the molding compound 210 is flipped over, such that the surface of the dies 208 that was in contact with the adhesive layer 204 is now the top surface (as opposed to the bottom surface). For one embodiment, the locations of the exposed contact pads 206 is measured and stored for further processing using a hybrid exposure operation, as described herein. For one embodiment, the surface of the dies 208 that is now that top surface includes the surfaces of the exposed contact pads 206. Furthermore, and in this embodiment, a surface of the exposed contact pads 206 is coplanar with a surface of the molding compound 210 and a surface of the passivation layer 205.

In FIG. 3G, a seed layer 211 is applied to the substrate illustrated in FIG. 3G. For one embodiment, the seed layer 211 is applied onto a surface of the molding compound 210, surfaces of the contact pads 206, and a surface of the passivation layer 205, where each of these surfaces are coplanar with each other. The seed layer 211 can be a thin seed layer formed from one or multiple layers. For one embodiment, the seed layer 211 is formed from at least one of Titanium (Ti), Copper (Cu), Chromium (Cr), Titanium-Tungsten (TiW), Zinc (Zn), Zinc Oxide (ZnO), Aluminium (Al), Tantalum (Ta), or any other suitable metal or metal alloy as is known in the art. For one embodiment, the seed layer 211 is deposited on the substrate illustrated in FIG. 3G as is known in the art. For example, the seed layer 211 is deposited using at least one of sputtering, electro-less seed layer plating, atomic layer deposition (ALD), or any other suitable deposition technique. For an alternate embodiment, a dielectric layer (not shown) is deposited on a surface of the die and a surface of the molding compound, where the surface of the die and the fan-out area created by the molding compound are coplanar with each other. The dielectric layer may be deposited on top of a metal layer (not shown) and/or other layers (not shown), where each of the at least one metal layer and/or the other layers is deposited on the die and the molding compound before the dielectric layer. Metal layers and the other layers that are deposited are known in the art so they will not be discussed in detail.

Furthermore, and for this alternate embodiment, the dielectric layer is deposited before the seed layer is deposited, such that the seed layer is applied on a top surface of the dielectric layer. The dielectric layer may be structured before the seed layer is applied on the dielectric layer. For a first example, the dielectric layer may be opened in areas where contact pads 206 of the semiconductor dies 208 are located. For a second example, the dielectric layer may be opened in areas where contact pads 206 of the semiconductor dies 208 are located that are not electrically coupled to the metal layer and/or the other layers deposited on the die and the molding compound. The dielectric layer may be deposited from a gas phase or from a solution, or can be laminated onto the die and the molding compound. Furthermore, thin-film technology methods or a standard PCB industry process flow can be used for the application of the dielectric layer. The dielectric layer may be fabricated from a polymer, such as parylene, photoresist material, imide, epoxy, duroplast, silicone, silicon nitride or an inorganic, ceramic-like material, such as silicone-carbon compounds. The thickness of the dielectric layer may be up to 10 μm or even higher.

For one embodiment, the dielectric layer acts as a stress buffer that assists with reducing or eliminating stress-induced damage to the contact pads 206. Stress buffering is known in the art so it will not be discussed in detail. To achieve the function of stress buffering, the dielectric layer can be a conductive material having at least one of a Young's modulus, a hardness, a strength, or a toughness that is great enough to protect the contact pads 206. For one embodiment, the dielectric layer is structured to act as a stress buffer as is known in the art.

For this alternate embodiment, the process further includes depositing the seed layer 211 on the top surface of the dielectric layer (not shown) and/or the underlying surfaces of the contact pads 206 exposed by the openings in the dielectric layer. The seed layer 211 may be made of a suitable metal or metal alloy and may have a thickness smaller than 300 nm. As explained above, the seed layer may be deposited by using, for example, sputtering, electroless deposition, evaporation or any other appropriate technique. Sputtering is a process whereby small particles, for example atoms, are ejected from a solid target material due to bombardment of the target by energetic particles, for example ions. Electroless deposition (also known as electroless or chemical or auto-catalytic or non-galvanic plating) involves the deposition of metal particles from a solution onto a surface without the use of external electrical power. That means that the solution containing the metal particles is applied to the surface to be coated with the metal, and the metal particles then adhere to the surface without the need of applying an external voltage to the solution and the surface. Evaporation involves evaporating a source material in a vacuum. The vacuum allows vapor particles to travel directly to the surface to be covered where the vapor particles condense back to a solid state.

For one embodiment, the seed layer 211 may consist of an adhesion promoter/diffusion barrier layer (not shown) and a layer providing electrical conductivity (not shown) (e.g., as illustrated by the seed layer 212 of FIG. 3K). For example, the seed layer 211 may be composed of two thin metal layers stacked on each other. First, a layer of titanium, titanium tungsten, chromium or any other suitable metal or metal alloy may be deposited on the top surfaces of the dielectric layer and the exposed contact pads. For one embodiment, this adhesion promoter/diffusion barrier layer of the seed layer 211 may have a thickness smaller than 100 nm and in one embodiment about 50 nm. The function of this first layer may be to promote the adhesion of further layers and to prevent the diffusion of metal particles into the semiconductor dies 208. A further metal layer, for example a copper layer, may be deposited on the adhesion promoter/diffusion barrier layer. For one embodiment, this layer may have a thickness smaller than 200 nm and in one embodiment about 150 nm. The function of this layer may be to provide sufficient electrical conductivity. The adhesion promoter/diffusion barrier layer as well as the layer providing electrical conductivity may be deposited by using sputtering, electroless deposition, evaporation or any other appropriate technique. Thus, each layer of the seed layer 211 may be deposited by using sputtering, electroless deposition, evaporation or any other appropriate technique.

Referring now to FIG. 3H, a resist layer 213 is applied to the seed layer 211. The resist layer 213 can be a spin-on resist layer, a dry film resist layer, or any other suitable resist layer known in the art. The resist layer 213 can be applied by spin-coating or any other suitable technology known in the art. For one embodiment, the resist layer 213 is one or more thin layers used to transfer a circuit pattern to the semiconductor substrate on which the resist layer 213 is deposited. The resist layer 213 can be patterned via lithography to form a (sub)micrometer-scale, temporary mask that protects selected areas of the underlying substrate during subsequent processing steps. The material used to prepare said thin layer is typically a viscous solution. The resist layer 213 can be formed from at least one of a polymeric material, an epoxy material, mixtures of polymers, or other small molecules (e.g. photoacid generators) that have been specially formulated for a given lithography technology. For one embodiment, the resist layer 213 is a photoresist layer, which is a specific type of resist layer used during photolithography. For a further embodiment, the photoresist layer 213 can be a positive photoresist layer or a negative photoresist layer.

In FIG. 3I, a hybrid exposure system 301 can be used to perform a first exposure operation 303 of a hybrid exposure operation to expose the resist layer 213. For one embodiment of FIG. 3I, the system 301 performs a first exposure operation 303 to expose a first portion of the resist layer 213. The system 301 can include one or more lithography tools, as described above in connection with FIG. 1. For one embodiment, the first exposure operation 303 is performed by at least one of a photolithography stepper or a mask aligner, as described above in connection with FIG. 1. In yet another embodiment, the first portion of the resist layer 213 that is exposed by the system 301 does not include one or more electrical communications pathways from the exposed first portion 213 to the contact pads 206 of the encapsulated dies 208. For a further embodiment, the first exposure operation 303 can also be performed using the measured position data locations, as described above in connection with FIG. 1. For yet another embodiment, the first exposure operation 303 can also be performed using an alignment of a photolithography stepper or a mask aligner that is based on the measured data locations, as described above in connection with FIG. 1. For one embodiment, the hybrid exposure system 301 includes at least one of the lithography tools described above in connection with FIG. 1. For a further embodiment, the system 301 includes a computer, as described above in connection with FIG. 1.

Figure 4A:
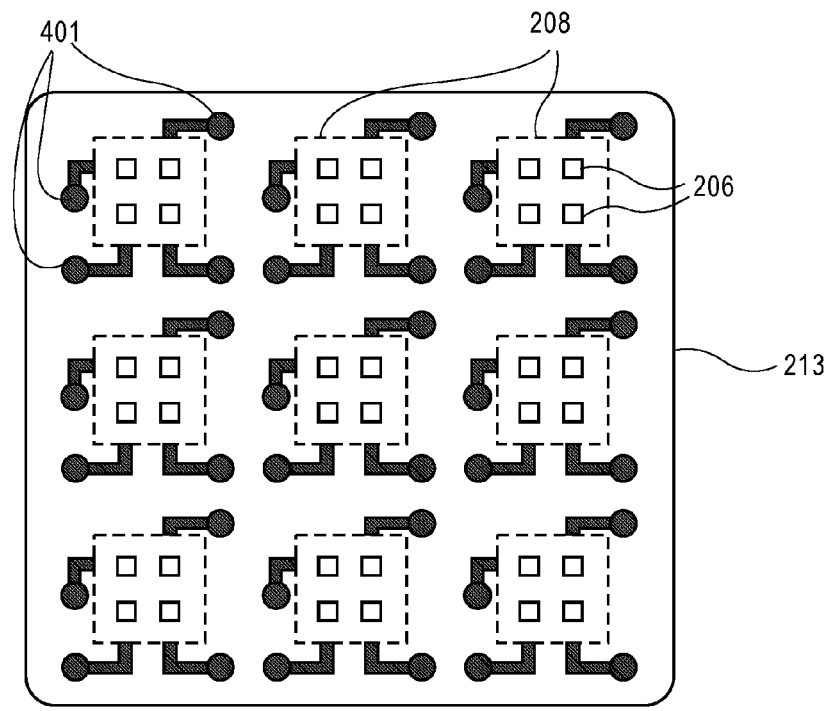
FIG. 4A is a schematic plan view of the processing operation illustrated in FIG. 3I, according to an embodiment.

Referring now to FIG. 4A, which illustrates a top view of the substrate illustrated in FIG. 3I after the first exposure operation 303 has been performed. As shown in FIG. 4A, the encapsulated dies 208 are not exposed and are under the resist layer 213. Furthermore, the contact pads 206 are also under the resist layer 213. The first portion of the resist layer 213, which can include material layer elements 401 (e.g., redistribution lines, interconnect openings, etc.), has been exposed using the first exposure operation 303, as described above in connection with FIG. 3I. FIG. 4A also shows that the electrical communications pathways that provide the electrical connections from the first portion that includes the material layer elements 401 to the contact pads 206 have not been exposed by the first exposure operation 303.

Referring now to FIG. 3J, the hybrid exposure system 301 can be used to perform a second exposure operation 305 of the hybrid exposure operation to expose the resist layer 213. For one embodiment of FIG. 3J, the system 301 performs the second exposure operation 305 to expose a second portion of the resist layer 213. The system 301 can include one or more lithography tools, as described above in connection with FIG. 1. For one embodiment, the second exposure operation 305 is performed by at least one of a digital imaging lithography tool (e.g., an LDI tool, etc.) or a maskless lithography tool, as described above in connection with FIG. 1. In yet another embodiment, the second portion of the resist layer 213 that is exposed by the system 301 includes one or more electrical communications pathway from the exposed first portion to the contact pads 206 of the encapsulated dies 208. For a further embodiment, the second exposure operation 305 can also be performed using the measured position data locations, as described above in connection with FIG. 1. For yet another embodiment, the second exposure operation 305 can also be performed using an alignment of a digital imaging lithography tool (e.g., an LDI tool, etc.) or a maskless lithography tool that is based on the measured data locations, as described above in connection with FIG. 1.

Figure 4B:
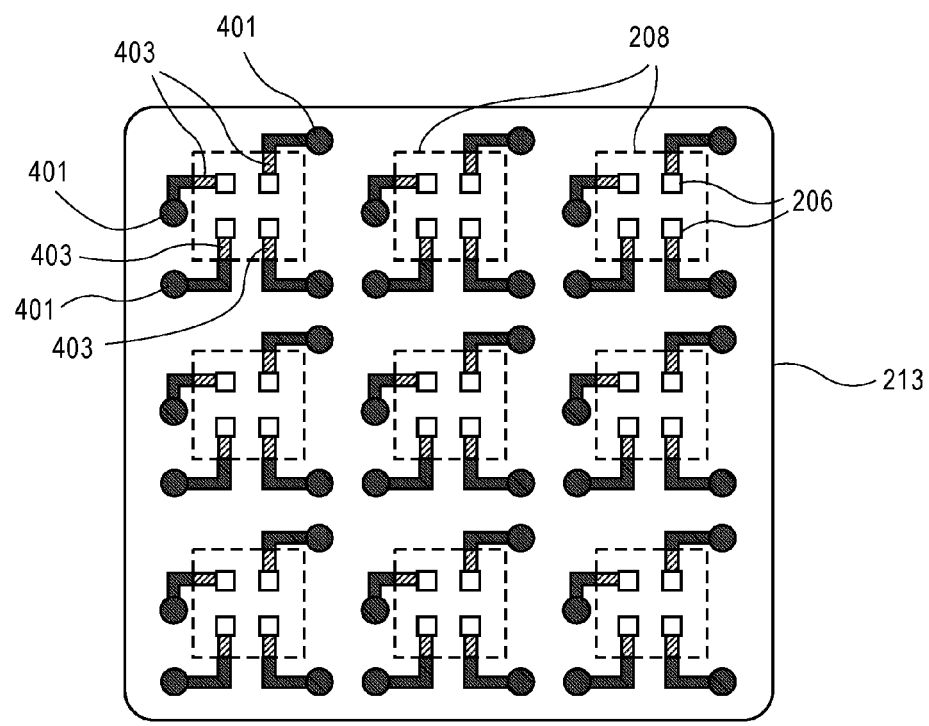
FIG. 4B is a schematic plan view of the processing operation illustrated in FIG. 3J, according to an embodiment of the invention.

Referring now to FIG. 4B, which illustrate a top view of the substrate illustrated in FIG. 3J after the first exposure operation 303 and second exposure operation 305 have been performed—i.e., after the hybrid exposure operation has been performed. As shown in FIG. 4B, the first portion of the resist layer 213, which can include material layer elements 401 (e.g., redistribution lines, interconnect openings, etc.), has been exposed using the first exposure operation 303 as described above in connection with FIG. 3I. FIG. 4B also shows that the electrical communications pathways 403 (e.g., conductive traces or redistribution lines, etc.) that enable the electrical connections from the first portion that includes the material layer elements 401 to the contact pads 206 have been exposed by the second exposure operation 305.

Referring now to FIG. 3K, a redistribution layer (RDL) 212 is formed over the top side of dies 108 (having exposed contact pads 106) and the molding compound 210. For an embodiment, the formation of the RDL 212 is performed after the hybrid exposure operation (i.e., the first exposure operation 303 and the second exposure operation 305) has been performed. For example, the RDL 212 and interconnects 214 are formed in accordance with the descriptions provided above in connection with at least one of FIGS. 2A-2I. For one embodiment, the formation of the RDL 212 and interconnects 214 is performed in accordance with process 20 of FIG. 1, which is described above.

As shown in FIG. 3K, the RDL 212 includes one or more redistribution lines 212A, openings for interconnects 212A, and passivation layers 212B that are electrically connected to the contact pads 106. For one embodiment, the one or more redistribution lines 212A and openings for interconnects 212A are connected to contact pads 206 via at least one electrical communications pathway that is formed in accordance with operations 303 and 305, as described above. The RDL 212, the redistribution lines 212A and the openings for interconnects 212A can be similar to or the same as the corresponding elements described above in connection with FIGS. 2A-2I.

Figure 4C:
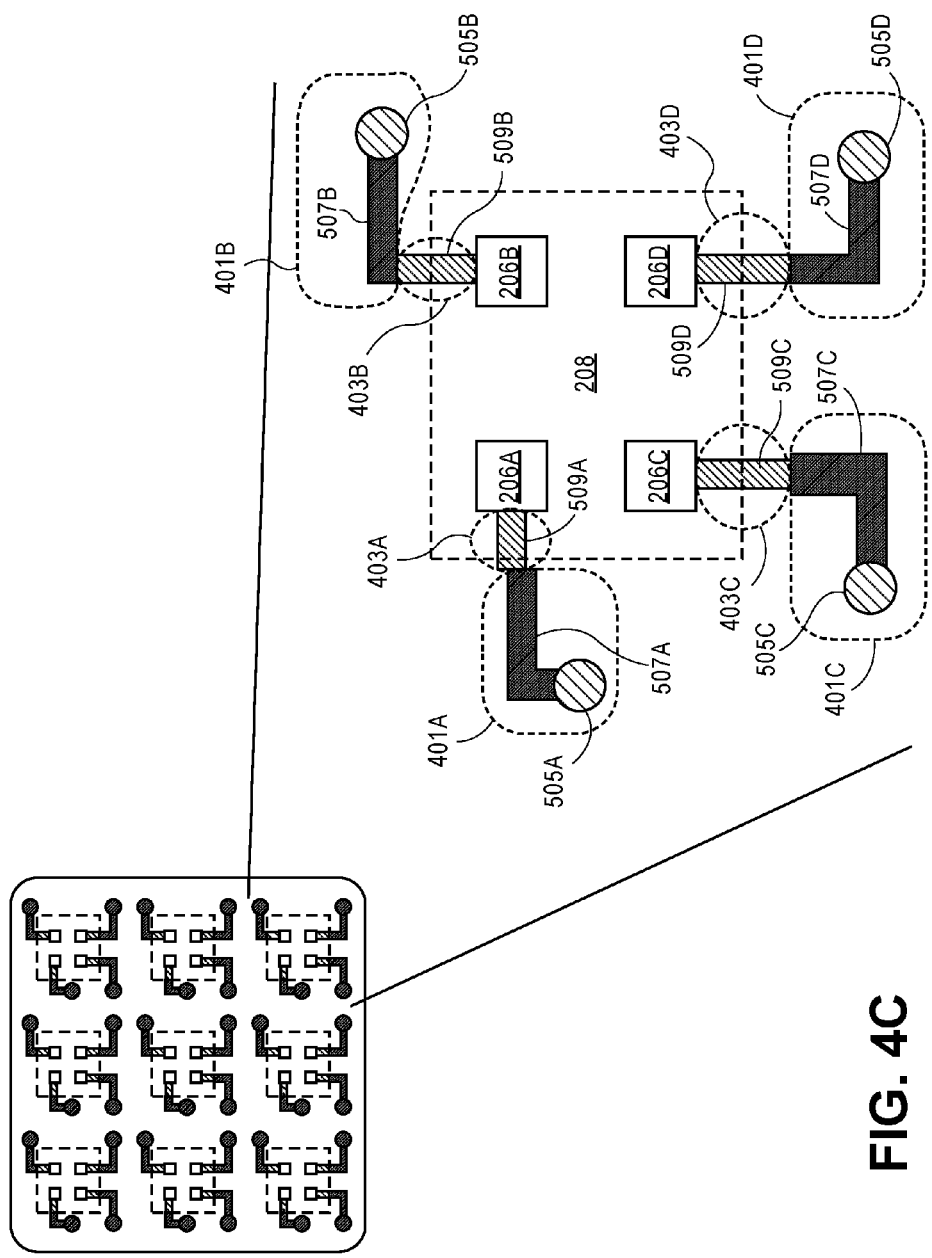
FIG. 4C is a schematic plan view of the processing operation illustrated in FIG. 3K, according to an embodiment of the invention.

Referring now to FIG. 4C, which is an exploded view of one of the semiconductor dies 208 shown in FIG. 4B after the operation 3K has been performed. The illustrated die 208 of FIG. 4C includes one or more contact pads 206A-D. In FIG. 4C, only four contact pads 206A-D are shown. There can be more or less than four contact pads in die 208. For one embodiment, and as illustrated in FIG. 4C, the formed RDL 212 includes the material layer elements 401 that were previously exposed using the first exposure operation 303 as described above in connection with FIG. 3I. Further, the RDL 212 also includes the electrical communications pathways 403 that were previously exposed by the second exposure operation 305 as described above in connection with FIG. 3J. For one embodiment, the material layer elements 401 of the RDL 212 include a redistribution structure that further includes (i) a region 505A for forming one or more opening for conductive interconnects (e.g., a bump region having a ring recess); and (ii) a first portion of a redistribution line 507A coupled or connected to the region 505A. For one embodiment, the electrical communications pathways 403 of RDL 212 include a second portion of the redistribution line 509A.

As shown in FIG. 4C, the first portion of the redistribution line 507A and the second portion of the redistribution line 509A collectively form a single redistribution line that electrically couples the region 505A to the contact pad 206A of die 208. One consequence of some embodiments of the hybrid exposure operation described herein is the creation of an artifact. As used herein, an "artifact," a "lithography artifact," or their variations refer to one or more physical features that are unique to a specific component of a semiconductor package (e.g., a redistribution line, a bump, etc.) in terms of that object's properties or combinations of properties, including at least one of structural, electrical, magnetic, electromagnetic, mechanical, or optical properties. An artifact of a specific component of a semiconductor package can be discovered by inspection. For example, by physical inspection.

For one embodiment, an artifact can be at least one of an amount of die rotation or an amount of die shift that results from undesirable die movement of a die, as described above in connection with FIG. 1. This artifact can generally be discovered by comparing at least one of a location, a movement, or a position of the die prior to the fabrication process with a corresponding one of the die's location, movement, and/or position after a molding compound encapsulates the die. For example, measurements acquired using the optional operation 40 (as described above in connection with FIG. 1) can be compared with position of the die after encapsulation. The exposed contact pads of the die can be used as a measure for determining the die's location, movement, and/or position within the molding compound.

For one embodiment, the use of the hybrid exposure operation described above in connection with 3I and 3J can result in a redistribution line of the subsequently formed RDL 212 that is an artifact. This redistribution line, which is an artifact that is attributable to the hybrid exposure operation, can assist with providing a more accurate electrical connection between contact pads of a die and material layers formed over the die and a fan-out area than was previously available. For example, and as shown in FIG. 4C, the redistribution line associated with contact pad 206A is an artifact because sidewalls of the first portion 507A are not substantially coplanar with sidewalls of the second portion 509A of the redistribution line. For yet another example, the redistribution line associated with the contact pad 206C is an artifact. This is because of the following: (i) sidewalls of the first portion 507C are not substantially coplanar with sidewalls of the second portion 509C of the redistribution line; and (ii) the distance between the sidewalls of the first portion 507C are not substantially equal to the distance between the sidewalls of the second portion 509C of the redistribution line.

For one embodiment, the use of the hybrid exposure operation described above in connection with 3I and 3J does not result in a redistribution line of the subsequently formed RDL 212 that is an artifact. For example, the redistribution line associated with contact pad 206B is not an artifact because at least one of the sidewalls of the first portion 507A is coplanar with at least one of the sidewalls of the second portion 509A. For yet another example, the redistribution line associated with the contact pad 206D is not an artifact because of the following: (i) at least one sidewall of the first portion 507D is at least substantially coplanar with at least one sidewall of the second portion 509D of the redistribution line; and (ii) the distance between the sidewalls of the first portion 507C are substantially equal to the distance between the sidewalls of the second portion 509C of the redistribution line.

Furthermore, the redistribution line associated with the contact pad 206C illustrates another example of a redistribution line that is not an artifact. For example, the redistribution line associated with contact pad 206C is an artifact because of the following: (i) sidewalls of the first portion 507C are not substantially coplanar with sidewalls of the second portion 509C of the redistribution line; and (ii) the distance between the sidewalls of the first portion 507C are not substantially equal to the distance between the sidewalls of the second portion 509C of the redistribution line.

Referring now to FIG. 3L, a first plurality of interconnects 214 (e.g., conductive bumps) is formed on a bottom side of the RDL 212. As shown in FIG. 3M, the wafer level stack is singulated along the dotted lines to obtain individual semiconductor packages 255. For one embodiment, the interconnects 214 are similar to or the same as the interconnects described above in connection with FIGS. 2A-2I.

FIGS. 5A-5D are schematic plan views of the processing operation illustrated in FIG. 3I, according to one embodiment. FIGS. 5A-5D provide additional details about the first exposure operation of the hybrid exposure operation described above in connection with at least FIGS. 1-4B. Even though the description provided below in connection with FIGS. 5A-5D is with regard to FIG. 3I, it is to be appreciated that the description applies to one or more of FIGS. 1-4B.

Figure 5A:
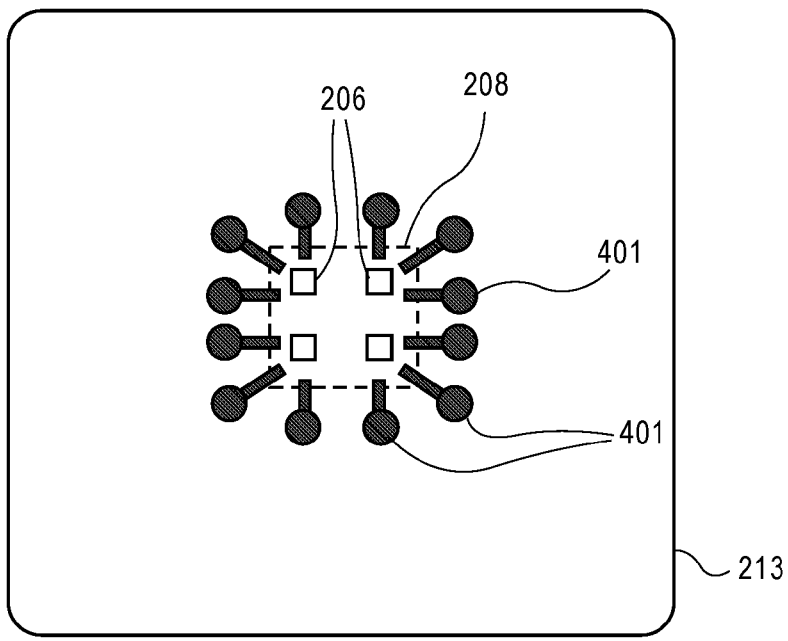
FIGS. 5A-5D are schematic plan views of the processing operation illustrated in FIG. 3I, according to one embodiment.

Referring now to FIG. 5A, which illustrates a top view of the substrate illustrated in FIG. 3I after the first exposure operation 303 has been performed. As shown in FIG. 5A, the first portion of the resist layer 213, which can include material layer elements 401 (e.g., redistribution lines, interconnect openings, etc.), has been exposed using the first exposure operation 303, as described above in connection with FIG. 3I. Specifically, the first portion of the resist layer 213 is exposed based on an ideal alignment given that the die 208 experienced minimal die movement after the processing operations described above in connection FIGS. 3A-3H.

As explained above in connection with FIG. 3I, the first exposure operation 303 is performed to expose a first portion of the resist layer 213 without exposing electrical communication pathways between the first portion and the contact pads 206. For one embodiment, the one or more lithography tools used to perform the first exposure operation 303 are aligned prior to the performance of the first exposure operation 303 to account for undesirable die movement that may have occurred during the processing operations described above in connection FIGS. 3A-3H. For one embodiment, the alignment of the lithography tool(s) used to perform the first exposure operation 303 is based on whether the semiconductor package is being fabricated for a radio frequency (RF) application or a non-RF application. As used herein, an "RF application" refers to a use that primarily involves generation, processing, and/or manipulation of radio frequency waves or signals. As used herein, a "non-RF application" refers to a use that does not primarily involve generation, processing, and/or manipulation of radio frequency waves or signals.

Packages used in RF applications are less tolerant of undesirable die movements than packages used in non-RF applications. For RF applications, the length of the RDL is an important value for the electrical performance of an electronic device. Consequently, the RDL must be kept constant across multiple packages with regard to the different redistribution lines on each package. For RF applications, the first alignment (also referred to as first exposure matrix) should be aligned to fit the die position in the reticle mask field. This is important to keep the offset from the RDL to the die as minimal as possible and to keep the differences in RDL length from package to package as minimal as possible. The alignment should be to all of the dies in the exposure field, but not to the outline of the package. On the other hand, for non-RF applications, the first alignment is centered to the package outline. For this case, the die shift may not exceed the value of the minimum pad pitch on the die in order to avoid short circuits (also referred to as shorts), which are accidental connections between the ICs of the exposed first portion. The adaption (i.e., the connections from the RDL to the contact pads) is done in the second alignment step with an LDI apparatus. Thus, for the first exposure operation 303, the alignment of the lithography tool(s) will be based on whether the package is to have a RF application or a non-RF application. For a further embodiment, one or more lithography tools that are used to perform the second exposure operation 305 are aligned prior to the performance based on whether the package is to have a RF application or a non-RF application.

Figure 5B:
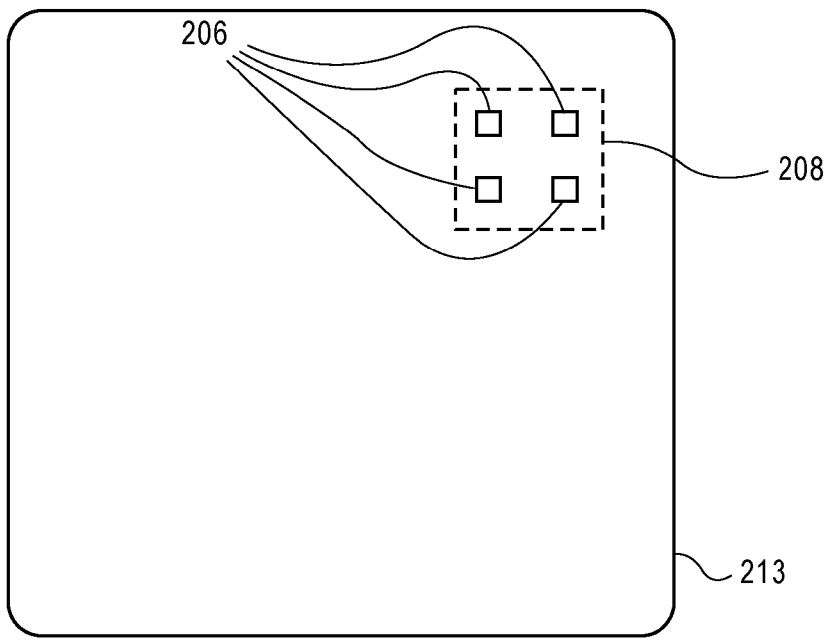

Referring now to FIG. 5B, which illustrates a top view of the substrate illustrated in FIG. 3I before the first exposure operation 303 has been performed. The die 208 has experienced die movement and is located in the top right location of the substrate (as opposed to the center of the substrate as shown in FIG. 5A). For this situation, the decision of how to align the lithography tool(s) used to perform the first exposure operation 303 is based in part on whether the semiconductor package being formed has a RF-application or a non-RF application. Undesirable die movement is described above in connection with at least one of FIGS. 1-4B.

Figure 5C:
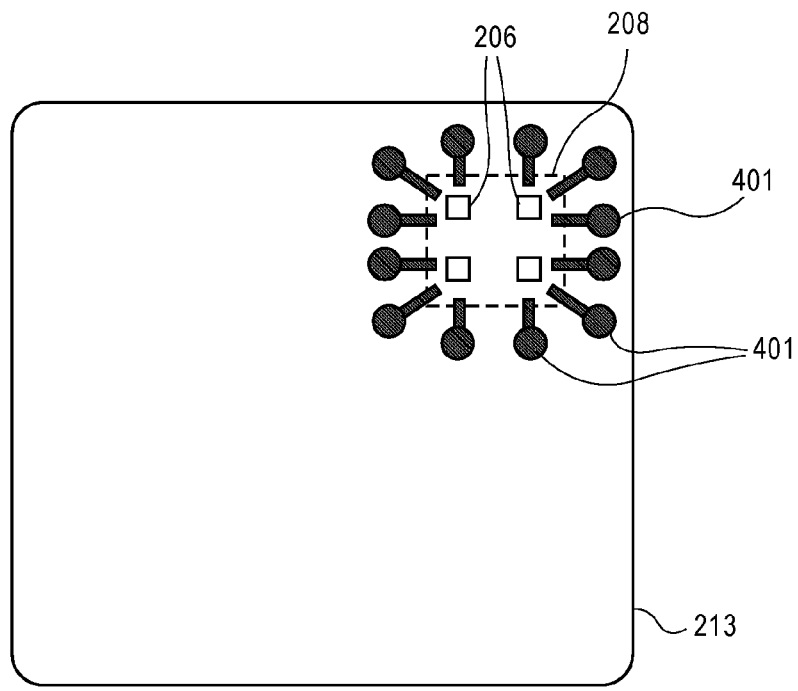

Referring now to FIG. 5C, which illustrates a top view of the substrate illustrated in FIG. 3I after the first exposure operation 303 has been performed. As shown in FIG. 5C, the first portion of the resist layer 213, which can include material layer elements 401 (e.g., redistribution lines, interconnect openings, etc.), has been exposed using the first exposure operation 303. Specifically, the first portion of the resist layer 213 is exposed based on an alignment for an RF application given the following: (i) the die 208 experienced die movement after resulting from the processing operations described above in connection FIGS. 3A-3H; and (ii) the semiconductor package being formed is to be have an RF application. The lithography tool(s), for one embodiment, that perform the first exposure operation 303 are aligned to the position of die 208 within the substrate. In this way, variation of the RDL length between across multiple packages will be minimal.

Figure 5D:
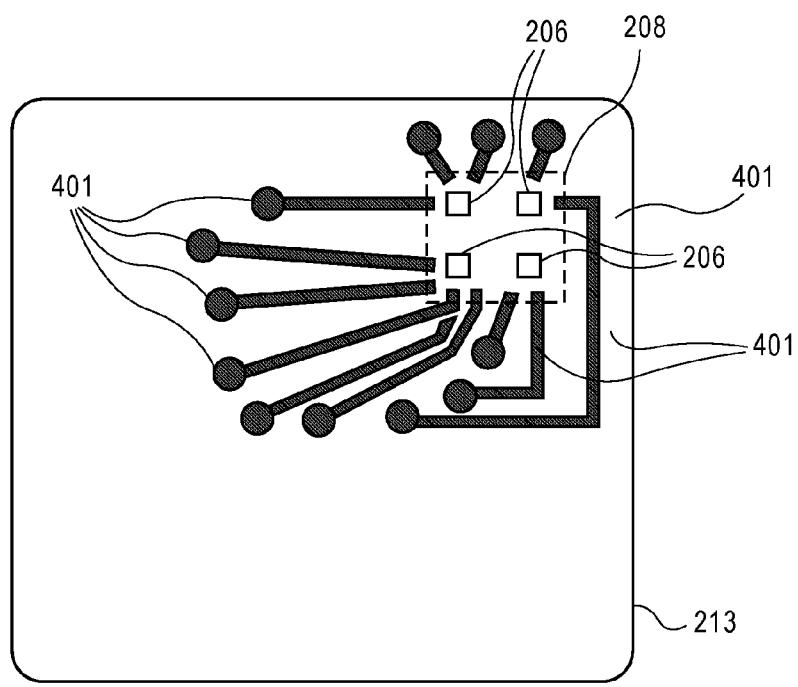

Referring now to FIG. 5D, which illustrates a top view of the substrate illustrated in FIG. 3I after the first exposure operation 303 has been performed. In FIG. 5D, the first portion of the resist layer 213, which can include material layer elements 401 (e.g., redistribution lines, interconnect openings, etc.), has been exposed using the first exposure operation 303. Specifically, the first portion of the resist layer 213 is exposed based on an alignment for a non-RF application given the following: (i) the die 208 experienced die movement after performance of the processing operations described above in connection FIGS. 3A-3H; and (ii) the semiconductor package being formed is to be have a non-RF application. The lithography tool(s), for one embodiment, that perform the first exposure operation 303 are aligned to the package outline (as opposed to the die 208) within the substrate. In FIG. 5D, the maximum allowed die shift is equal to a desired pad pitch so as to avoid shorts. In this way, there is a reduced need to determine the exact location of the die within the substrate, which can speed up the packaging process and reduce packaging costs.

Figure 6:
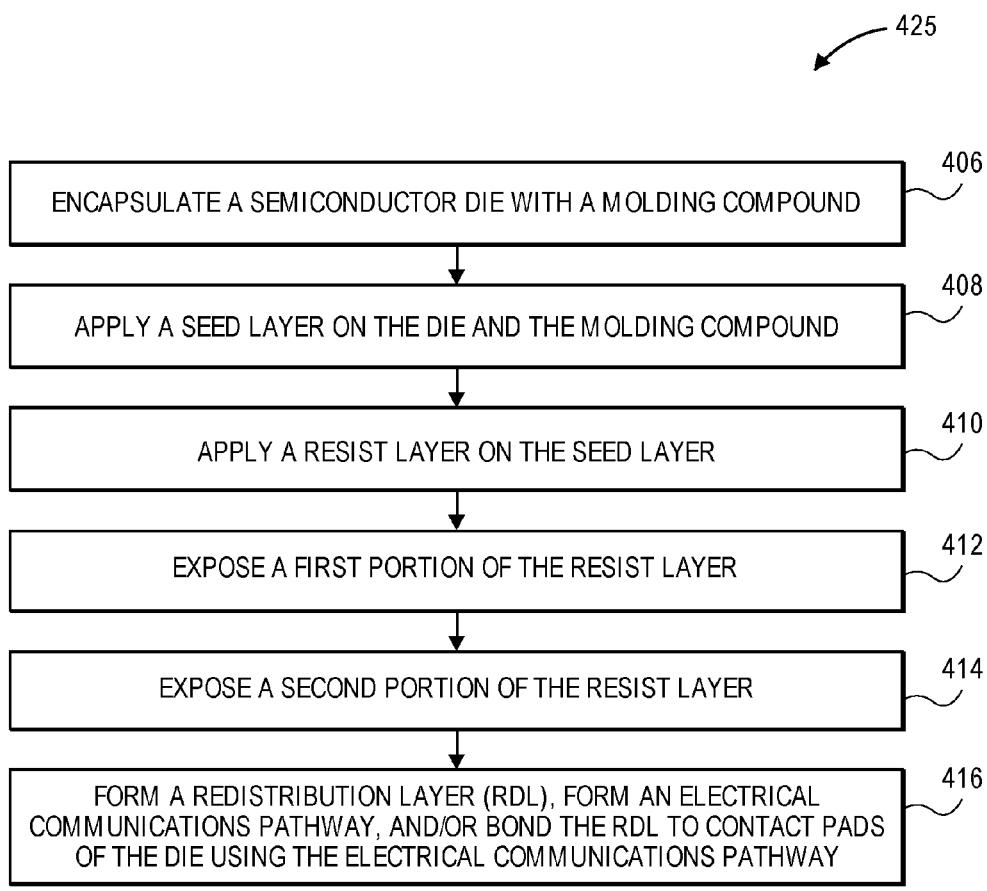
FIG. 6 is a process flow illustration of a method of forming a semiconductor package that includes a fan-out area according to one embodiment.

Referring to FIG. 6, a process flow 425 is provided for a method of forming a semiconductor package in accordance with an embodiment. Process flow 425 can be part of a process, such as an embedded wafer level process or an embedded panel level process. For one embodiment, the formation of the semiconductor package is in accordance with at least one of FIG. 1, 2A-2-I, or 3A-5B as described above. Process flow 425 for forming a semiconductor package begins at block 406, where a die is encapsulated with a molding compound, as described above in at least one of FIG. 1, 2A-2-I, or 3A-5B. At block 408, a seed layer is applied on the die and the molding compound, as described above in at least one of FIG. 1, 2A-2-I, or 3A-5B. At block 410, a resist layer is applied on the seed layer, as described above in at least one of FIG. 1, 2A-2-I, or 3A-5B.

Block 412 includes exposing a first portion of the resist layer. For one embodiment, the first portion includes a first area of the resist layer to be used for forming one or more material layers (e.g., a redistribution layer (RDL), etc.) without including a second area of the resist layer to be used for forming an electrical communications pathway (e.g., redistribution lines 112A, etc.) between at least one of the contact pads of the die and the one or more material layers (e.g., an RDL, etc.). For one embodiment, the exposure of the first portion of the resist layer is performed in accord with the descriptions provided above in connection with at least one of FIG. 1, 2A-2-I, or 3A-5B. At block 414, a second portion of the resist layer is exposed. For an embodiment, the second portion includes the second area of the resist layer that includes the electrical communications pathway, as described above in at least one of FIG. 1, 2A-2-I, or 3A-5B.

Block 416 includes forming the one or more material layers (e.g., an RDL, etc.), forming the electrical communications pathway, and/or bonding the one or more material layers (e.g., an RDL, etc.) to contact pads of the die using the electrical communications pathway, as described above in at least one of FIG. 1, 2A-2-I, or 3A-5B. For one embodiment, the formation of the one or more material layers (e.g., an RDL, etc.), the formation of the electrical communications pathway, and/or the bonding of the one or more material layers (e.g., an RDL, etc.) to contact pads of the die using the electrical communications pathway is performed using known processes in the art. As a first example, and for one embodiment, an RDL and the electrical communications pathway is formed after the exposed resist layer is processed, etched, and patterned to form the RDL and the pathway. As a second example, and for one embodiment, an RDL and the communications pathway is fabricated by electroplating in a strong agitated electrolyte. Other suitable deposition, patterning, and/or etching processes for forming the RDL and the communications pathway are also acceptable, including galvanic plating, or chemical plating, electro-less plating, electroplating, and conductive printing.

Figure 7:
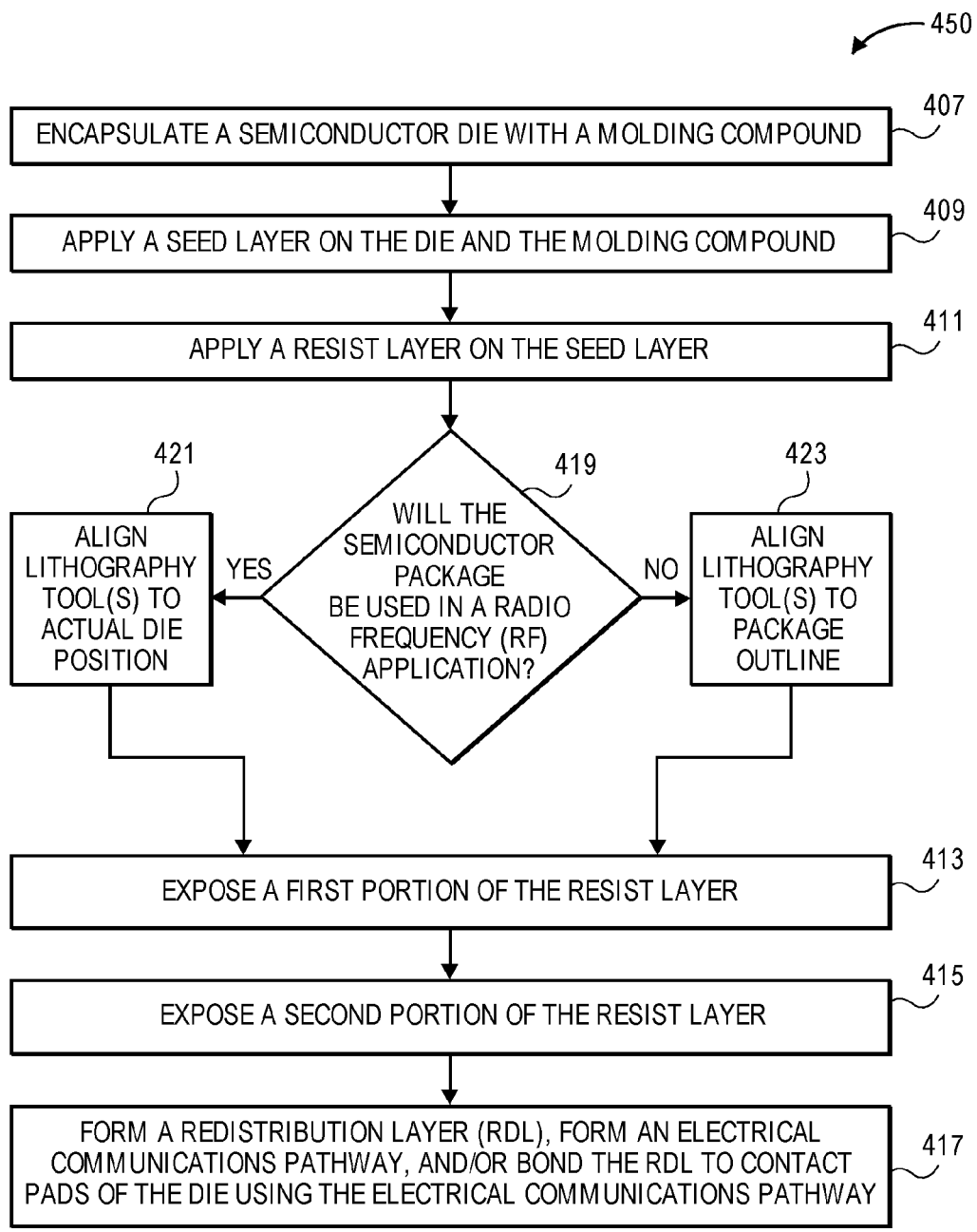
FIG. 7 is a process flow illustration of a method of forming a semiconductor package that includes a fan-out area according to one embodiment.

Referring to FIG. 7, a process flow 450 is provided for a method of forming a semiconductor package in accordance with an embodiment. Process flow 450 can be part of a process, such as an embedded wafer level process or an embedded panel level process. For one embodiment, the formation of the semiconductor package is in accordance with at least one of FIG. 1, 2A-2-I, or 3A-5B as described above. Process flow 450 for forming a semiconductor package begins at block 407, where a die is encapsulated with a molding compound, as described above in at least one of FIG. 1, 2A-2-I, or 3A-5B. At block 409, a seed layer is applied on the die and the molding compound, as described above in at least one of FIG. 1, 2A-2-I, or 3A-5B. At block 411, a resist layer is applied on the seed layer, as described above in at least one of FIG. 1, 2A-2-I, or 3A-5B.

At decision block 419, it is determined whether the semiconductor package being formed is for an RF application or a non-RF application, as described above in connection with FIGS. 5A-5D. If the package is for an RF application, the lithography tool(s) to be used for the first exposure operation are aligned to the actual die position within the package, as described above in connection with FIGS. 5A-5D. On the other hand, if the package is for a non-RF application, the lithography tool(s) to be used for the first exposure operation are aligned to the outline of the package (as opposed to the actual die), as described above in connection with FIGS. 5A-5D.

Block 413 is similar to or the same as block 412, which is described above in connection with FIG. 6. Block 415 is similar to or the same as block 415, which is described above in connection with FIG. 6. Block 417 is similar to or the same as block 416, which is described above in connection with FIG. 6.

Figure 8:
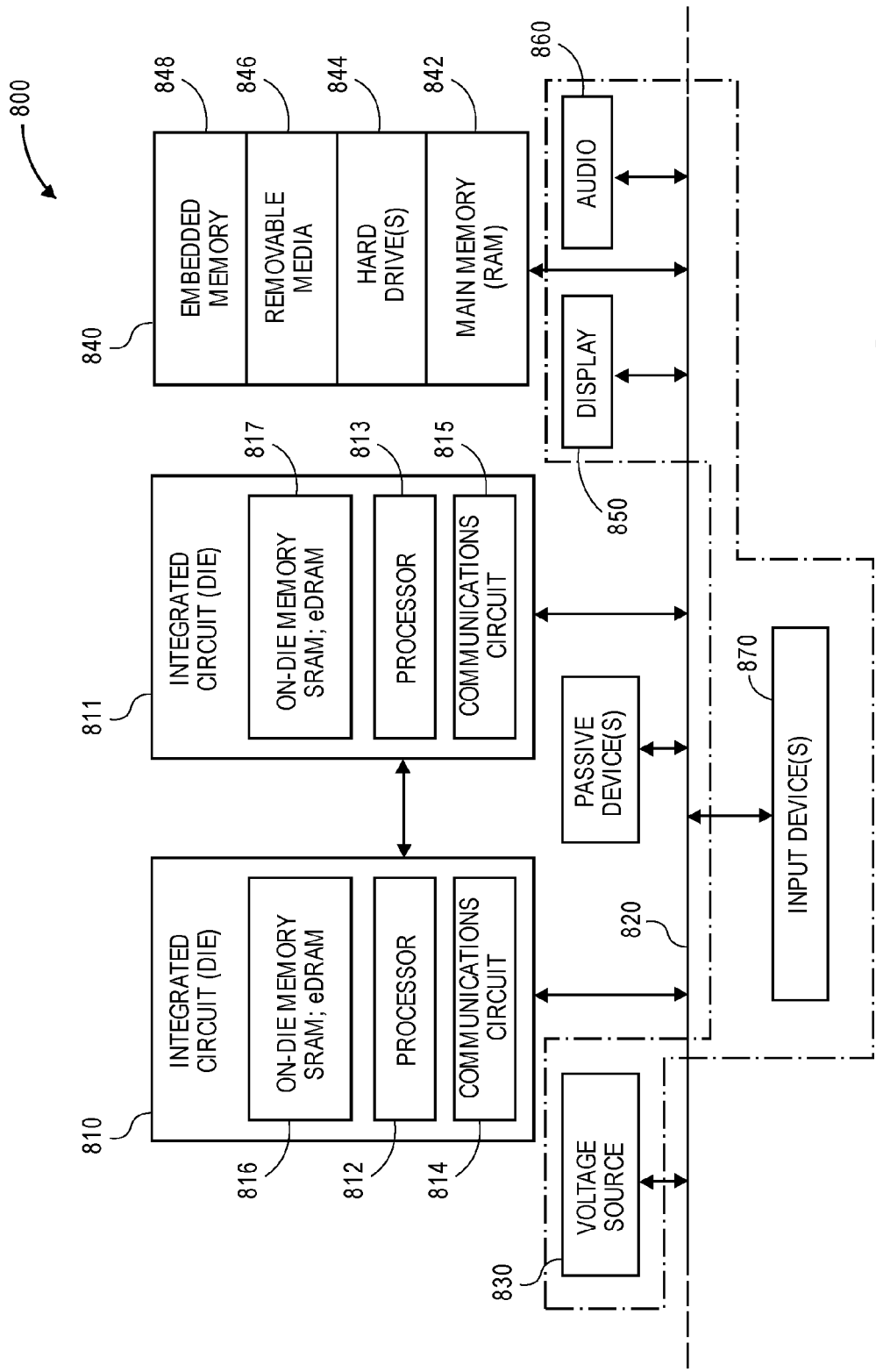
FIG. 8 is an illustration of a schematic block diagram of a computer system that utilizes a semiconductor package, according to an embodiment.

FIG. 8 illustrates a schematic of computer system 800 according to an embodiment. The computer system 800 (also referred to as an electronic system 800) can include a semiconductor package that is formed from a process that includes a hybrid exposure operation in accord with any of the embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

The electronic system 800 can be a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. For an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. For an embodiment, the processor 812 includes, or is coupled with, a semiconductor package formed with a process that includes one or more embodiments of a hybrid exposure operation, as described in the foregoing specification. For an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. For an embodiment, the integrated circuit 810 includes on-die memory 816 such as static random-access memory (SRAM). For an embodiment, the integrated circuit 810 includes embedded on-die memory 816 such as embedded dynamic random-access memory (eDRAM). For one embodiment, the on-die memory 816 may be packaged with a process that includes one or more embodiments of a hybrid exposure operation, as described in the foregoing specification.

For an embodiment, the integrated circuit 810 is complemented with a subsequent integrated circuit 811. Useful embodiments include a dual processor 813 and a dual communications circuit 815 and dual on-die memory 817 such as SRAM. For an embodiment, the dual integrated circuit 810 includes embedded on-die memory 817 such as eDRAM.

For an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

For an embodiment, the electronic system 800 also includes a display device 850 and an audio output 860. For an embodiment, the electronic system 800 includes an input device such as a controller 870 that may be a keyboard, mouse, trackball, game controller, microphone, voice-recognition device, or any other input device that inputs information into the electronic system 800. For an embodiment, an input device 870 is a camera. For an embodiment, an input device 870 is a digital sound recorder. For an embodiment, an input device 870 is a camera and a digital sound recorder.

At least one of the integrated circuits 810 or 811 can be implemented in a number of different embodiments, including a semiconductor package formed from a process that includes the hybrid exposure operation, according to any of the several embodiments and their equivalents, an electronic system, a computer system, one or more methods of fabricating an integrated circuit, and one or more methods of fabricating an electronic assembly that includes a semiconductor package formed with a process that includes the hybrid exposure operation, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed a semiconductor package that is formed with a process that includes the hybrid exposure operation, according to any of the several disclosed embodiments as set forth herein and their art-recognized equivalents. A foundation substrate may be included, as represented by the dashed line of FIG. 8. Passive devices may also be included, as is also depicted in FIG. 8.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "for an embodiment," "for another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments of hybrid exposure operation included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or Figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing from the broader spirit and scope of the embodiments described in connection with the foregoing specification, abstract, and/or Figures.

Embodiments described herein include a method of forming a semiconductor package, the method comprising: encapsulating a semiconductor die with a molding compound, wherein a surface of contact pads of the die are coplanar with a surface of the molding compound; applying a seed layer on the die and the molding compound, wherein the seed layer is applied on the surface of the molding compound that is coplanar with the surface of the contact pads on each of the semiconductor dies; applying a resist layer on the seed layer; exposing a first portion of the resist layer, wherein the first portion includes a first area of the resist layer to be used for forming a redistribution layer (RDL) without including a second area of the resist layer to be used for forming an electrical communications pathway between at least one of the contact pads and the RDL; and exposing a second portion of the resist layer, wherein the second portion includes the second area of the resist layer that includes the electrical communications pathway.

Additional embodiments include a method, wherein the first portion is exposed using a first lithography tool, wherein the second portion is exposed using a second lithography tool, and wherein the first and second lithography tools are different from each other.

Additional embodiments include a method, wherein the first lithography tool is a photolithography stepper or a mask aligner and wherein the second lithography tool is an apparatus used for direct imaging lithography or maskless lithography.

Additional embodiments include a method, wherein the second lithography tool is a laser direct imaging (LDI) apparatus.

Additional embodiments include a method, further comprising: measuring a location of the semiconductor die with an inspection tool to generate die location information; and aligning at least one of the first or second lithography tools based on the die location information, wherein at least one of the first or second portions is exposed based on the alignment.

Additional embodiments include a method, wherein, when the semiconductor package is being formed for a radio frequency (RF) application, the first lithography tool is aligned using the actual location of the die, and wherein, when the semiconductor package is being formed for a non-RF application, the first lithography tool is aligned using the outline of semiconductor package and a die shift is not to exceed a predetermined pitch.

Additional embodiments include a method, wherein at least one of a location, a movement, or a position of the die prior to encapsulation changes after encapsulation of the die within the molding compound, and wherein the change can be discovered by inspection.

Additional embodiments include a method, wherein the semiconductor die is transferred onto an adhesive layer that is on a carrier prior to the encapsulation with the molding compound, and wherein the adhesive layer and the carrier are removed after the encapsulation.

Additional embodiments include a method, further comprising: removing the first and second portions of the resist layer to open up the first and second areas of the seed layer, respectively; forming the redistribution layer in the first area; forming the electrical communications pathway in the second area; and bonding the redistribution layer to at least one of the contact pads using the electrical communications pathway.

Additional embodiments include a method, wherein the forming of the redistribution layer includes forming one or more opening for conductive interconnects.

Additional embodiments include a method, wherein the forming of the redistribution layer in the first area includes forming a first portion of a redistribution line, wherein the forming of the electrical communications pathway in the second area includes forming a second portion of the redistribution line, and wherein the first portion of the redistribution line is electrically coupled to the second portion of the redistribution line.

Additional embodiments include a method, wherein sidewalls of the first portion of the redistribution line are not substantially coplanar with sidewalls of the second portion of the redistribution line.

Additional embodiments include a method, wherein a distance between the sidewalls of the first portion are not substantially equal to a distance between the sidewalls of the second portion of the redistribution line.

Additional embodiments include a method, wherein at least one sidewall of the first portion of the redistribution line is substantially coplanar with at least one sidewall of the second portion of the redistribution line.

Additional embodiments include a method, wherein a distance between the sidewalls of the first portion is substantially equal to a distance between the sidewalls of the second portion of the redistribution line.

Embodiments described herein include a semiconductor package comprising: a semiconductor die; a molding compound encapsulating the semiconductor die, wherein a surface of contact pads of the die are coplanar with a surface of the molding compound; and a redistribution layer on the semiconductor die and the molding compound, wherein the redistribution layer includes a redistribution line that has a first portion and a second portion, and wherein sidewalls of the first portion of the redistribution line are not substantially coplanar with sidewalls of the second portion of the redistribution line.

Additional embodiments include a semiconductor package, wherein a distance between the sidewalls of the first portion are not substantially equal to a distance between the sidewalls of the second portion of the redistribution line.

Additional embodiments include a semiconductor package, wherein the redistribution line is discoverable by an inspection tool.

Additional embodiments include a semiconductor package, wherein the redistribution line is discoverable by an inspection tool.

Embodiments described herein include a semiconductor package comprising: a semiconductor die; a molding compound encapsulating the semiconductor die, wherein a surface of contact pads of the die are coplanar with a surface of the molding compound; and a redistribution layer on the semiconductor die and the molding compound, wherein the redistribution layer includes a redistribution line that has a first portion and a second portion, and wherein at least one sidewall of the first portion of the redistribution line is substantially coplanar with at least one sidewall of the second portion of the redistribution line.

Additional embodiments include a semiconductor package, wherein at least one of a location, a movement, or a position of the die prior to encapsulation changes after encapsulation of the die within the molding compound, and wherein the change can be discovered by inspection.

Embodiments described herein include a method of forming a semiconductor package, the method comprising: encapsulating a semiconductor die with a molding compound, wherein a surface of contact pads of the die are coplanar with a surface of the molding compound; applying a dielectric layer on the die and the molding compound, wherein the dielectric layer is applied on the surface of the molding compound that is coplanar with the surface of the contact pads on each of the semiconductor dies; applying a seed layer on the dielectric layer; applying a resist layer on the seed layer; exposing a first portion of the resist layer, wherein the first portion includes a first area of the resist layer to be used for forming a redistribution layer (RDL) without including a second area of the resist layer to be used for forming an electrical communications pathway between at least one of the contact pads and the RDL; and exposing a second portion of the resist layer, wherein the second portion includes the second area of the resist layer that includes the electrical communications pathway.

Additional embodiments include a method, further comprising: applying at least one metal layer on the surface of the molding compound that is coplanar with the surface of the contact pads on each of the semiconductor dies, wherein the at least one metal layer is applied before the dielectric layer is applied.

Additional embodiments include a method, further comprising: structuring the dielectric layer, wherein the dielectric layer is structured before the seed layer is applied on the dielectric layer.

Additional embodiments include a method, wherein structuring the dielectric layer includes forming openings in the dielectric layer, wherein the openings are formed where the contact pads of the die are located, wherein each opening corresponds to one of the contact pads, and wherein applying the seed layer on the dielectric layer includes applying the seed layer on the underlying surfaces of the contact pads exposed by the openings.

Additional embodiments include a method, wherein structuring the dielectric layer includes structuring the dielectric layer to act as a stress buffer.

Additional embodiments include a method, wherein at least one of a location, a movement, or a position of the die prior to encapsulation changes after encapsulation of the die within the molding compound, and wherein the change can be discovered by inspection.

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A method of forming a semiconductor package, the method comprising:
   encapsulating a semiconductor die with a molding compound, wherein a surface of contact pads of the die are coplanar with a surface of the molding compound;
   applying a seed layer on the die and the molding compound, wherein the seed layer is applied on the surface of the molding compound that is coplanar with the surface of the contact pads on each of the semiconductor dies;
   applying a resist layer on the seed layer;
   exposing a first portion of the resist layer, wherein the first portion includes a first area of the resist layer to be used for forming a redistribution layer (RDL) without including a second area of the resist layer to be used for forming an electrical communications pathway between at least one of the contact pads and the RDL; and
   exposing a second portion of the resist layer, wherein the second portion includes the second area of the resist layer that includes the electrical communications pathway, wherein the exposed portions of the resist layer are exposed using one or more patterning tools, and the one or more patterning tools include at least one or more lithography tools.

2. The method of claim 1, wherein the first portion is exposed using a first lithography tool, wherein the second portion is exposed using a second lithography tool, and wherein the first and second lithography tools are different from each other.

3. The method of claim 2, wherein the first lithography tool is a photolithography stepper or a mask aligner and wherein the second lithography tool is an apparatus used for direct imaging lithography or maskless lithography.

4. The method of claim 3, wherein the second lithography tool is a laser direct imaging (LDI) apparatus.

5. The method of claim 2, further comprising:
   measuring a location of the semiconductor die with an inspection tool to generate die location information; and aligning at least one of the first or second lithography tools based on the die location information, wherein at least one of the first or second portions is exposed based on the alignment.

6. The method of claim 5, wherein, when the semiconductor package is being formed for a radio frequency (RF) application, the first lithography tool is aligned using the actual location of the die, and wherein, when the semiconductor package is being formed for a non-RF application, the first lithography tool is aligned using the outline of semiconductor package and a die shift is not to exceed a predetermined pitch.

7. The method of claim 1, wherein at least one of a location, a movement, or a position of the die prior to encapsulation changes after encapsulation of the die within the molding compound, and wherein the change can be discovered by inspection.

8. The method of claim 1, wherein the semiconductor die is transferred onto an adhesive layer that is on a carrier prior to the encapsulation with the molding compound, and wherein the adhesive layer and the carrier are removed after the encapsulation.

9. The method of claim 1, further comprising:
removing the first and second portions of the resist layer to open up the first and second areas of the seed layer, respectively;
forming the redistribution layer in the first area;
forming the electrical communications pathway in the second area; and
bonding the redistribution layer to at least one of the contact pads using the electrical communications pathway.

10. The method of claim 9, wherein the forming of the redistribution layer includes forming one or more opening for conductive interconnects.

11. The method of claim 9, wherein the forming of the redistribution layer in the first area includes forming a first portion of a redistribution line, wherein the forming of the electrical communications pathway in the second area includes forming a second portion of the redistribution line, and wherein the first portion of the redistribution line is electrically coupled to the second portion of the redistribution line.

12. The method of claim 11, wherein sidewalls of the first portion of the redistribution line are not substantially coplanar with sidewalls of the second portion of the redistribution line.

13. The method of claim 12, wherein a distance between the sidewalls of the first portion are not substantially equal to a distance between the sidewalls of the second portion of the redistribution line.

14. The method of claim 11, wherein at least one sidewall of the first portion of the redistribution line is substantially coplanar with at least one sidewall of the second portion of the redistribution line.

15. The method of claim 14, wherein a distance between the sidewalls of the first portion is substantially equal to a distance between the sidewalls of the second portion of the redistribution line.

16. A semiconductor package comprising:
a semiconductor die;
a molding compound encapsulating the semiconductor die, wherein a surface of contact pads of the die are coplanar with a surface of the molding compound; and
a redistribution layer on the semiconductor die and the molding compound, wherein the redistribution layer includes a redistribution line that has a first portion and a second portion, wherein one or more different patterning tools are used to expose the portions of the redistribution line, and wherein sidewalls of the first portion of the redistribution line are not substantially coplanar with sidewalls of the second portion of the redistribution line.

17. The package of claim 16, wherein a distance between the sidewalls of the first portion are not substantially equal to a distance between the sidewalls of the second portion of the redistribution line.

18. The package of claim 16, wherein the redistribution line is discoverable by an inspection tool.

19. The package of claim 17, wherein the redistribution line is discoverable by an inspection tool.

20. A semiconductor package comprising:
a semiconductor die;
a molding compound encapsulating the semiconductor die, wherein a surface of contact pads of the die are coplanar with a surface of the molding compound; and
a redistribution layer on the semiconductor die and the molding compound, wherein the redistribution layer includes a redistribution line that has a first portion and a second portion, wherein one or more different patterning tools are used to expose the portions of the redistribution line, and wherein at least one sidewall of the first portion of the redistribution line is substantially coplanar with at least one sidewall of the second portion of the redistribution line.

21. The semiconductor package of claim 20, wherein at least one of a location, a movement, or a position of the die prior to encapsulation changes after encapsulation of the die within the molding compound, and wherein the change can be discovered by inspection.

22. A method of forming a semiconductor package, the method comprising:
encapsulating a semiconductor die with a molding compound, wherein a surface of contact pads of the die are coplanar with a surface of the molding compound;
applying a dielectric layer on the die and the molding compound, wherein the dielectric layer is applied on the surface of the molding compound that is coplanar with the surface of the contact pads on each of the semiconductor dies;
applying a seed layer on the dielectric layer;
applying a resist layer on the seed layer;
exposing a first portion of the resist layer, wherein the first portion includes a first area of the resist layer to be used for forming a redistribution layer (RDL) without including a second area of the resist layer to be used for forming an electrical communications pathway between at least one of the contact pads and the RDL; and
exposing a second portion of the resist layer, wherein the second portion includes the second area of the resist layer that includes the electrical communications pathway, wherein the exposed portions of the resist layer are exposed using one or more different patterning tools.

23. The method of claim 22, further comprising:
applying at least one metal layer on the surface of the molding compound that is coplanar with the surface of the contact pads on each of the semiconductor dies, wherein the at least one metal layer is applied before the dielectric layer is applied.

24. The method of claim 22, further comprising:
structuring the dielectric layer, wherein the dielectric layer is structured before the seed layer is applied on the dielectric layer, and wherein structuring the dielectric layer includes:
structuring the dielectric layer to act as a stress buffer, and
forming openings in the dielectric layer, wherein the openings are formed where the contact pads of the die are located, wherein each opening corresponds to one of the contact pads, and wherein applying the seed layer on the dielectric layer includes applying the seed layer on the underlying surfaces of the contact pads exposed by the openings.

25. The method of claim 22, wherein at least one of a location, a movement, or a position of the die prior to encapsulation changes after encapsulation of the die within the molding compound, and wherein the change can be discovered by inspection.

\* \* \* \* \*